(12) United States Patent
Choi et al.

(10) Patent No.: US 11,158,696 B2
(45) Date of Patent: Oct. 26, 2021

(54) ELECTROLUMINESCENT DISPLAY APPARATUS

(71) Applicant: LG Display Co., Ltd., Seoul (KR)

(72) Inventors: Howon Choi, Paju-si (KR); YongBaek Lee, Paju-si (KR); Eunil Cho, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 79 days.

(21) Appl. No.: 16/527,593

(22) Filed: Jul. 31, 2019

(65) Prior Publication Data

US 2020/0135823 A1 Apr. 30, 2020

(30) Foreign Application Priority Data

Oct. 30, 2018 (KR) .................. 10-2018-0130787

(51) Int. Cl.
*H01L 27/32* (2006.01)
*H01L 27/12* (2006.01)

(52) U.S. Cl.
CPC ...... *H01L 27/3262* (2013.01); *H01L 27/1218* (2013.01); *H01L 27/1251* (2013.01); *H01L 27/3211* (2013.01)

(58) Field of Classification Search
None
See application file for complete search history.

(56) References Cited

U.S. PATENT DOCUMENTS

| | | | |
|---|---|---|---|
| 2016/0127717 A1* | 5/2016 | Petrov | G09G 3/36 345/419 |
| 2017/0125496 A1 | 5/2017 | Oh et al. | |
| 2017/0141176 A1* | 5/2017 | Im | H01L 51/5228 |
| 2017/0294155 A1* | 10/2017 | Kim | H01L 27/3248 |
| 2018/0006259 A1* | 1/2018 | Paek | H01L 51/5206 |
| 2019/0096971 A1* | 3/2019 | Ukigaya | H01L 51/5012 |
| 2020/0185472 A1* | 6/2020 | Park | H01L 27/3246 |

FOREIGN PATENT DOCUMENTS

| | | |
|---|---|---|
| KR | 10-2009-0002717 A | 1/2009 |
| KR | 10-2017-0052766 A | 5/2017 |
| KR | 10-2018-0003719 A | 1/2018 |

* cited by examiner

*Primary Examiner* — Nduka E Ojeh
(74) *Attorney, Agent, or Firm* — Morgan, Lewis & Bockius LLP

(57) ABSTRACT

An electroluminescent display apparatus includes: a substrate, a plurality of subpixels on the substrate, a first electrode respectively in each of the plurality of subpixels, the first electrode including: a first sub-electrode, and a second sub-electrode, a light-emitting layer on the first electrode, and a second electrode on the light-emitting layer, wherein a whole upper surface of each of the first sub-electrode and the second sub-electrode contacts a lower surface of the light-emitting layer.

21 Claims, 22 Drawing Sheets

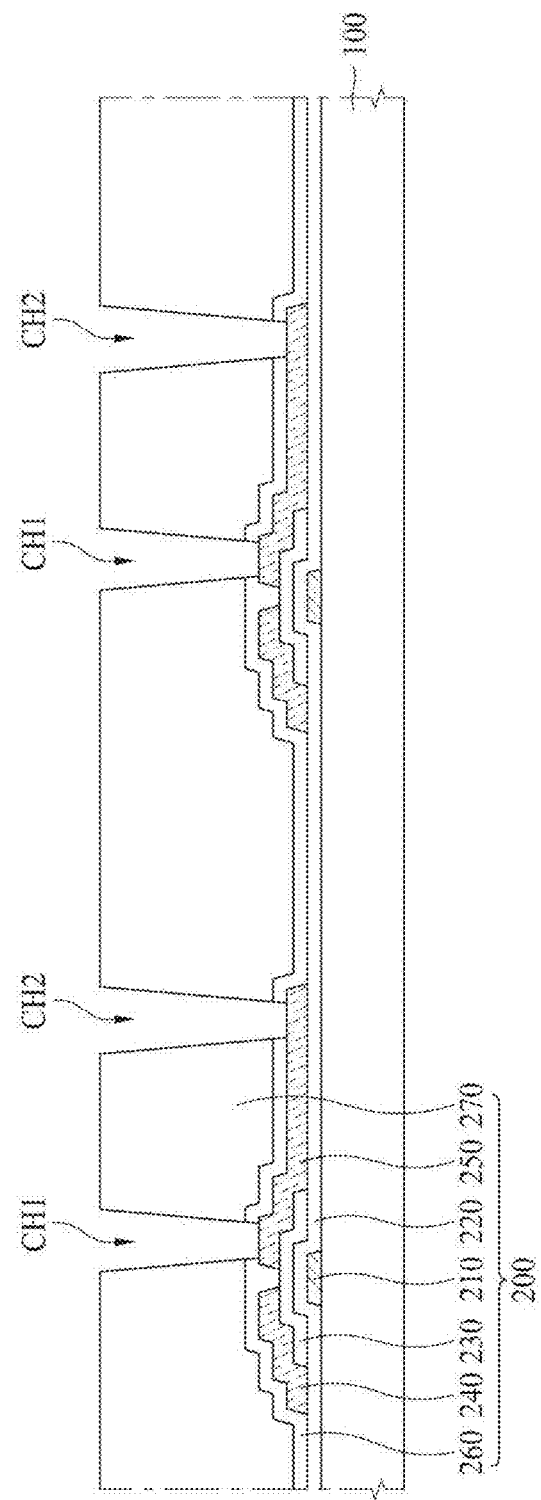

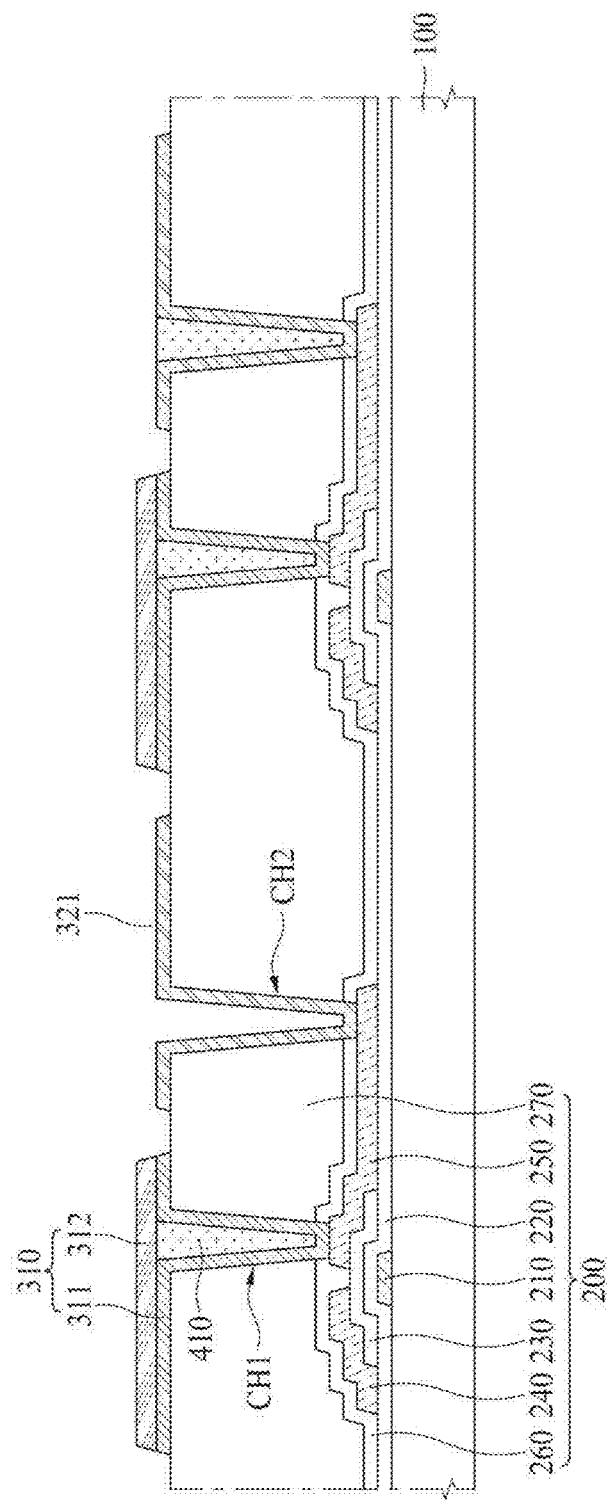

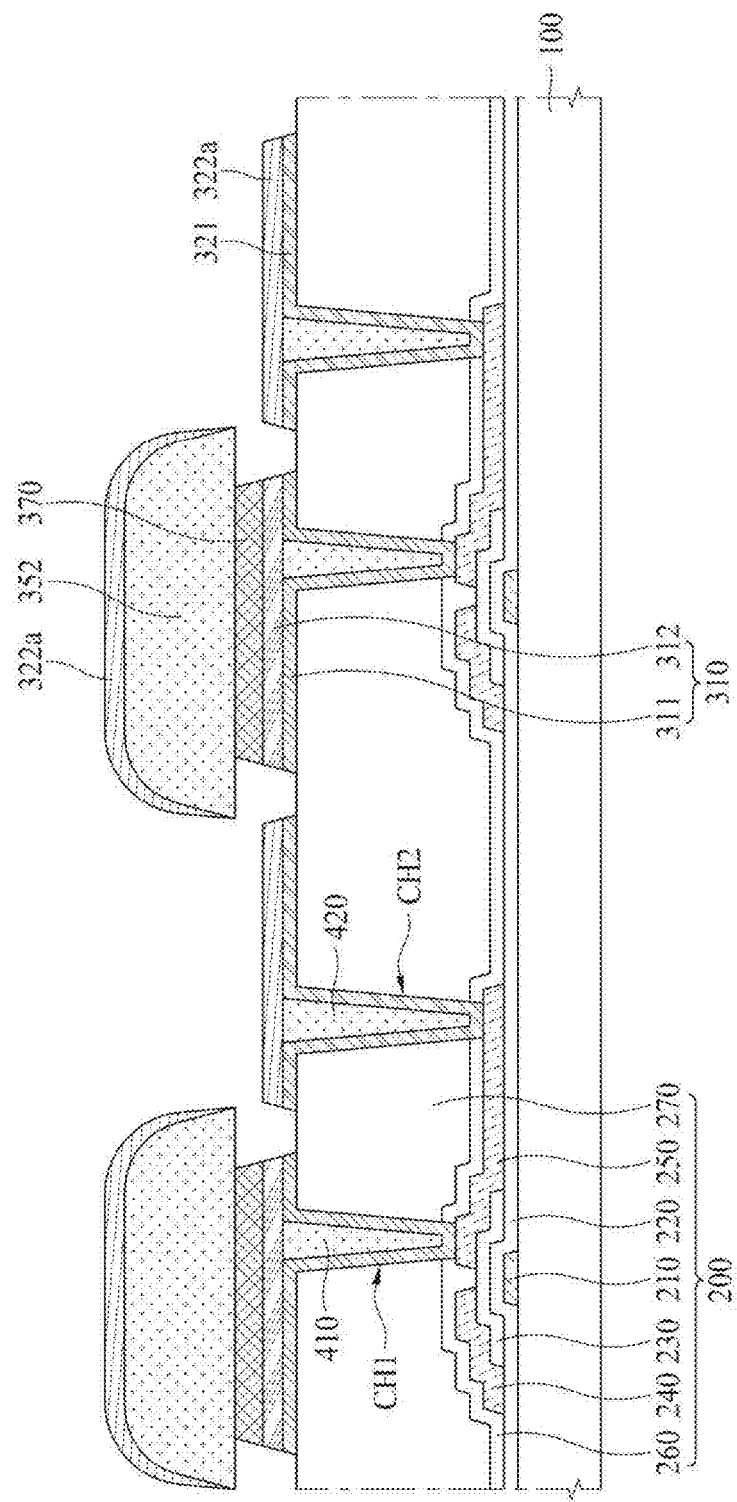

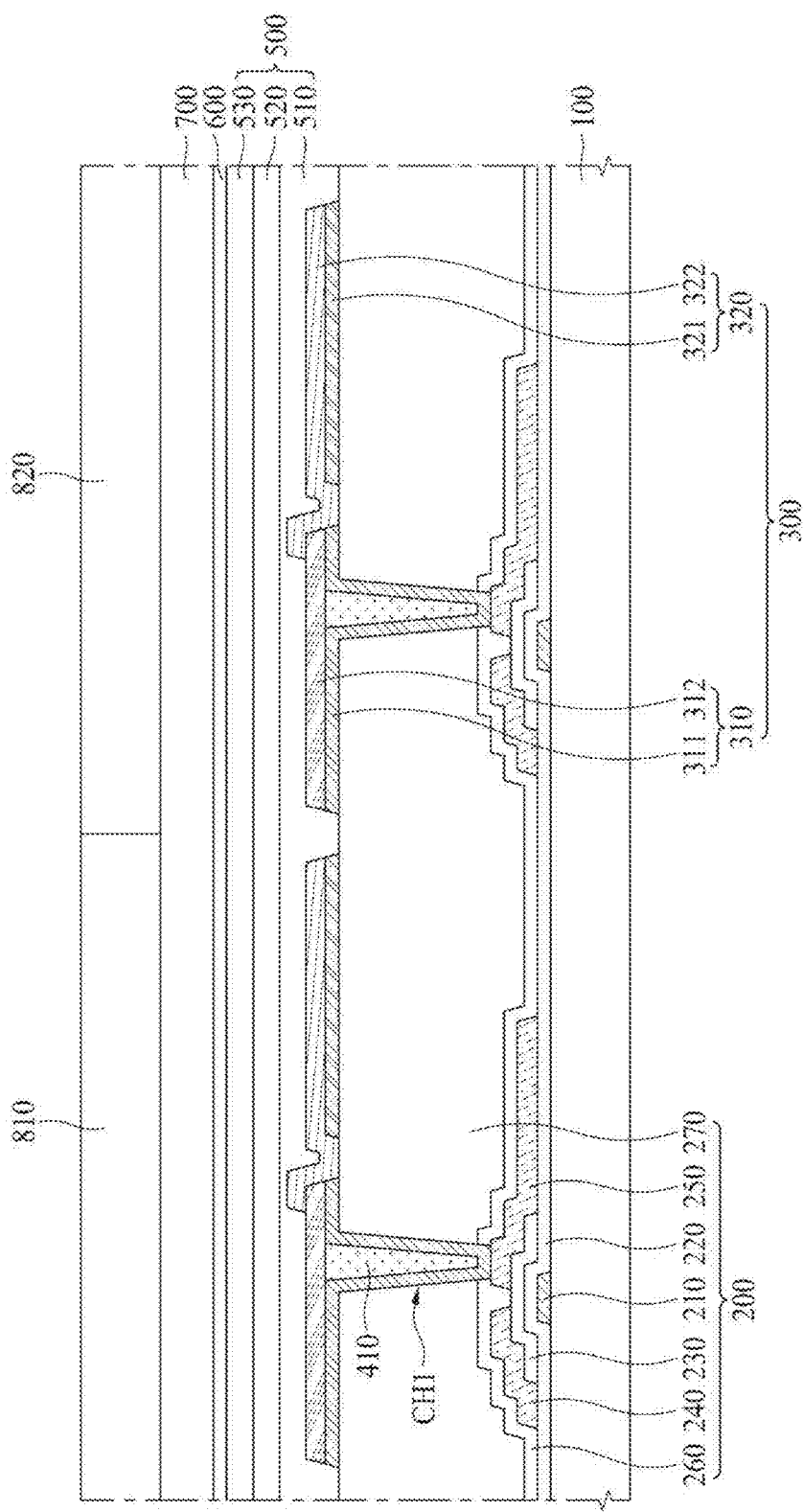

ELECTROLUMINESCENT DISPLAY APPARATUS

CROSS-REFERENCE TO RELATED APPLICATION(S)

This application claims the benefit of and priority to Korean Patent Application No. 10-2018-0130787, filed on Oct. 30, 2018, the entirety of which is hereby incorporated by reference.

BACKGROUND

1. Technical Field

The present disclosure relates to an electroluminescent display apparatus, and more particularly, to an electroluminescent display apparatus for emitting white light.

2. Discussion of the Related Art

Electroluminescent display apparatuses are apparatuses in which a light-emitting layer is provided between two electrodes (e.g., an anode electrode and a cathode electrode), and which emit light with an electric field generated between the two electrodes, thereby displaying an image. The light-emitting layer may include an organic material or an inorganic material, such as a quantum dot. In the light-emitting layer, an exciton is generated by a combination of an electron and a hole, and when the exciton is shifted from an excited state to a ground state, light is emitted.

The light-emitting layer may emit light of different colors (for example, red, green, and blue) in subpixels, and may emit light of the same color (for example, white light) in each of the subpixels. When the light-emitting layer emit light of different colors by unis of subpixels, because different light-emitting layers are deposited in subpixels by using a mask, there is a limitation in which a mask process is additionally performed. When a mask is not precisely aligned, there is a problem in which it is difficult to deposit the light-emitting layer in each subpixel. On the other hand, when the light-emitting layer emits light of the same color (for example, white light) in each subpixel, a mask for forming a pattern of the light-emitting layer is not needed. Thus, a problem caused by a mask process does not occur.

In a related art electroluminescent display apparatus, an interval between subpixels should be maintained as at least a certain distance. Thus, there is a limitation in enhancing an aperture ratio.

SUMMARY

Accordingly, the present disclosure is directed to an electroluminescent display apparatus that substantially obviates one or more of the issues due to limitations and disadvantages of the related art.

An aspect of the present disclosure is to provide an electroluminescent display apparatus in which an interval between subpixels is reduced, and thus, an aperture ratio is enhanced.

Additional features and aspects will be set forth in the description that follows, and in part will be apparent from the description, or may be learned by practice of the inventive concepts provided herein. Other features and aspects of the inventive concepts may be realized and attained by the structure particularly pointed out in the written description, or derivable therefrom, and the claims hereof as well as the appended drawings.

To achieve these and other aspects of the inventive concepts as embodied and broadly described, there is provided an electroluminescent display apparatus, including: a substrate, a plurality of subpixels on the substrate, a first electrode respectively in each of the plurality of subpixels, the first electrode including: a first sub-electrode, and a second sub-electrode, a light-emitting layer on the first electrode, and a second electrode on the light-emitting layer, wherein a whole upper surface of each of the first sub-electrode and the second sub-electrode contacts a lower surface of the light-emitting layer.

In another aspect, there is provided an electroluminescent display apparatus, including: a substrate; a first subpixel and a second subpixel on the substrate; and a first electrode respectively in each of the first subpixel and the second subpixel on the substrate; a light-emitting layer on the first electrode; and a second electrode on the light-emitting layer, wherein the first electrode of the first subpixel and the first electrode of the second subpixel face each other with the light-emitting layer therebetween, and wherein one side surface of each of the first electrode of the first subpixel and the first electrode of the second subpixel facing each other contacts the light-emitting layer.

Other systems, methods, features and advantages will be, or will become, apparent to one with skill in the art upon examination of the following figures and detailed description. It is intended that all such additional systems, methods, features and advantages be included within this description, be within the scope of the present disclosure, and be protected by the following claims. Nothing in this section should be taken as a limitation on those claims. Further aspects and advantages are discussed below in conjunction with embodiments of the disclosure. It is to be understood that both the foregoing general description and the following detailed description of the present disclosure are examples and explanatory, and are intended to provide further explanation of the disclosure as claimed.

BRIEF DESCRIPTION OF THE DRAWINGS

The patent or application file contains at least one drawing executed in color. Copies of this patent or patent application publication with color drawing(s) will be provided by the Office upon request and payment of the necessary fee.

The accompanying drawings, that may be included to provide a further understanding of the disclosure and are incorporated in and constitute a part of this specification, illustrate embodiments of the disclosure and together with the description serve to explain various principles of the disclosure.

FIGS. 3A to 3K are manufacturing process cross-sectional views of an electroluminescent display apparatus according to an embodiment of the present disclosure.

FIG. 10 is a cross-sectional view of an electroluminescent display apparatus according to an embodiment of the present disclosure.

Figure 1:
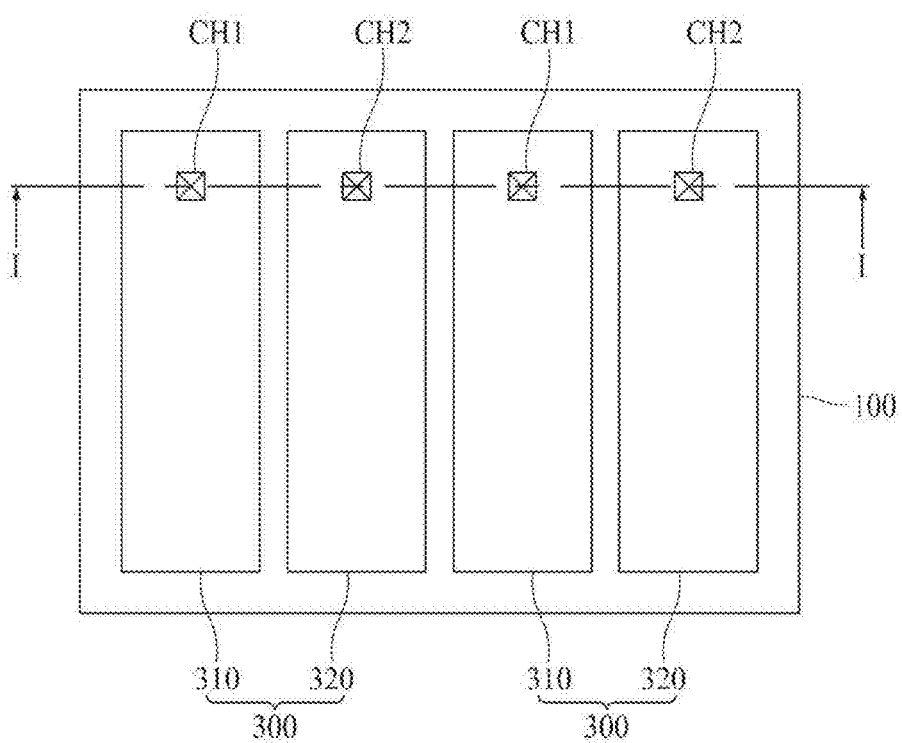
FIG. 1 is a plan view of an electroluminescent display apparatus according to an embodiment of the present disclosure.

Throughout the drawings and the detailed description, unless otherwise described, the same drawing reference numerals should be understood to refer to the same elements, features, and structures. The relative size and depiction of these elements may be exaggerated for clarity, illustration, and convenience.

DETAILED DESCRIPTION

Reference will now be made in detail to embodiments of the present disclosure, examples of which may be illustrated in the accompanying drawings. In the following description, when a detailed description of well-known functions or configurations related to this document is determined to unnecessarily cloud a gist of the inventive concept, the detailed description thereof will be omitted. The progression of processing steps and/or operations described is an example; however, the sequence of steps and/or operations is not limited to that set forth herein and may be changed as is known in the art, with the exception of steps and/or operations necessarily occurring in a particular order. Like reference numerals designate like elements throughout. Names of the respective elements used in the following explanations are selected only for convenience of writing the specification and may be thus different from those used in actual products.

It will be understood that, although the terms "first," "second," etc. may be used herein to describe various elements, these elements should not be limited by these terms. These terms are only used to distinguish one element from another. For example, a first element could be termed a second element, and, similarly, a second element could be termed a first element, without departing from the scope of the present disclosure.

The term "at least one" should be understood as including any and all combinations of one or more of the associated listed items. For example, the meaning of "at least one of a first item, a second item, and a third item" denotes the combination of all items proposed from two or more of the first item, the second item, and the third item as well as the first item, the second item, or the third item.

In the description of embodiments, when a structure is described as being positioned "on or above" or "under or below" another structure, this description should be construed as including a case in which the structures contact each other as well as a case in which a third structure is disposed therebetween. The size and thickness of each element shown in the drawings are given merely for the convenience of description, and embodiments of the present disclosure are not limited thereto.

Features of various embodiments of the present disclosure may be partially or overall coupled to or combined with each other, and may be variously inter-operated with each other and driven technically as those skilled in the art can sufficiently understand. Embodiments of the present disclosure may be carried out independently from each other, or may be carried out together in co-dependent relationship.

Hereinafter, an electroluminescent display apparatus according to an embodiment of the present disclosure will be described in detail with reference to the accompanying drawings.

FIG. 1 is a plan view of an electroluminescent display apparatus according to an embodiment of the present disclosure.

As seen in the example of FIG. 1, the electroluminescent display apparatus according to an embodiment of the present disclosure may include a substrate 100 and a first electrode 300. A first subpixel P1 and a second subpixel P2 may be provided on the substrate 100.

The first subpixel P1 and the second subpixel P2 may be adjacent to each other. The first subpixel P1 may emit light having one color among red (R), green (G), and blue (B), and the second subpixel P2 may emit light having another color among red (R), green (G), and blue (B). Although not shown, a third subpixel adjacent to the second subpixel P2 may be additionally provided, and the third subpixel may emit light having yet another color of red (R), green (G), and blue (B). Embodiments are not limited to these colors.

The first electrode 300 may be patterned in each of the subpixels P1 and P2. For example, one first electrode 310 may be in the first subpixel P1, and one other first electrode 300 may be in the second subpixel P2. The first electrode 300 may function as an anode of the electroluminescent display apparatus. The first electrode 300 may have a tetragonal (e.g., quadrilateral) structure, but embodiments are not limited thereto and may be changed to various structures known to those skilled in the art.

The first electrode 300 may include a first sub-electrode 310 and a second sub-electrode 320, which may be adjacent to each other. The first sub-electrode 310 may be spaced apart from the second sub-electrode 320 in each of the subpixels P1 and P2. Also, the first sub-electrode 310 and the second sub-electrode 320 may be arranged in the same order in each of the subpixels P1 and P2. Therefore, the second sub-electrode 320 of the first subpixel P1 may face the first sub-electrode 310 of the second subpixel P2.

The first sub-electrode 310 in each of the subpixels P1 and P2 may be connected to, via a first contact hole CH1, a driving thin-film transistor (TFT) in each of the subpixels P1 and P2. The second sub-electrode 320 in each of the subpixels P1 and P2 may be connected to, via a second contact hole CH2, to the driving TFT in each of the subpixels P1 and P2. Therefore, the first sub-electrode 310 and the second sub-electrode 320, each provided in the first subpixel P1, may be connected to the driving TFT in the first subpixel P1, and may be simultaneously driven by the driving TFT. Also, the first sub-electrode 310 and the second sub-electrode 320, each provided in the second subpixel P2, may be connected to the driving TFT in the second subpixel P2, and may be simultaneously driven by the driving TFT.

According to an embodiment of the present disclosure, when a bank for dividing individual subpixels is not provided, an interval between the subpixels P1 and P2 may be reduced, thereby decreasing an aperture ratio corresponding to a ratio of a region, where light may be emitted, of a whole region of the substrate 100. Hereinafter, an electroluminescent display apparatus according to an embodiment of the present disclosure will be described in more detail with respect to a cross-sectional structure and a manufacturing process.

Figure 2:
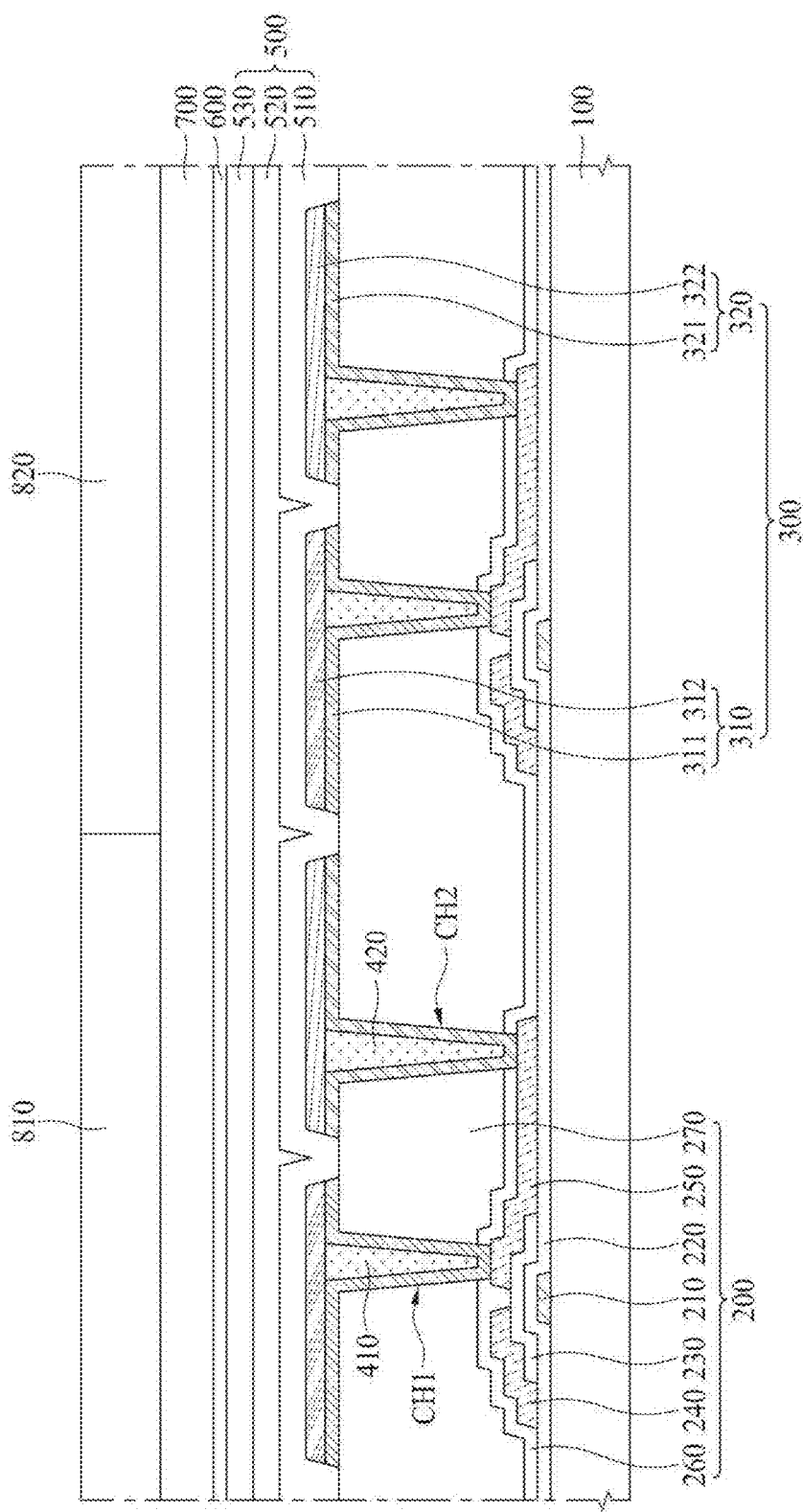
FIG. 2 is a cross-sectional view of an electroluminescent display apparatus according to an embodiment of the present disclosure.

FIG. 2 is a cross-sectional view of an electroluminescent display apparatus according to an embodiment of the present disclosure.

FIG. 2 corresponds to a cross-sectional surface taken along line I-I of FIG. 1. As seen in the example of FIG. 2, the electroluminescent display apparatus according to an embodiment of the present disclosure may include a substrate 100, a circuit device layer 200, a first electrode 300, a plurality of filling layers (for example, first and second fillings) 410 and 420, a light-emitting layer 500, a second electrode 600, an encapsulation layer 700, and a plurality of color filter layers 810 and 820.

The substrate 100 may include glass or plastic, but embodiments are not limited thereto, and may include a semiconductor material, such as a silicon wafer. The substrate 100 may include a transparent material or an opaque material. The electroluminescent display apparatus according to an embodiment of the present disclosure may be implemented as a top-emission type in which emitted light may be discharged to an upper portion. Accordingly, a material of the substrate 100 may use an opaque material, as well as a transparent material.

The circuit device layer 200 may be provided on the substrate 100. A circuit device, including various signal lines, a thin-film transistor (TFT), a capacitor, and the like, may be provided in the circuit device layer 200 in each of subpixels.

The signal lines may include a gate line, a data line, a power line, and a reference line. The TFT may include a switching TFT, a driving TFT, and a sensing TFT.

The switching TFT may be turned on according to a gate signal supplied through the gate line, and may transfer a data voltage, supplied through the data line, to the driving TFT. The driving TFT may be turned on with the data voltage supplied through the switching TFT, and may generate a data current from power supplied through the power line to supply the data current to the first electrode 300.

The sensing TFT may sense a threshold voltage deviation of the driving TFT, which may cause the degradation in image quality, and may supply a current of the driving TFT to the reference line in response to a sensing control signal supplied through the gate line or a separate sensing line. The capacitor may hold the data voltage supplied to the driving TFT during one frame, and may be connected to a gate terminal and a source terminal of the driving TFT.

The circuit device layer 200 may include a gate electrode 210 on the substrate 100, a gate insulation layer 220 on the gate electrode 210, a semiconductor layer 230 on the gate insulation layer 220, and a source electrode 240 and a drain electrode 250, which may face each other on the semiconductor layer 230. The driving TFT may be provided in a top-gate structure in addition to a bottom-gate structure, but embodiments are not limited thereto, and may be changed to various structures known to those skilled in the art. Each of the switching TFT and the sensing TFT may be provided in the same structure as that of the driving TFT, but embodiments are not limited thereto.

The circuit device layer 200 may further may include a passivation layer 260, which may be on the source electrode 240 and the drain electrode 250, and a planarization layer 270 on the passivation layer 260. The passivation layer 260 may protect the driving TFT, and may include an inorganic insulating material, but embodiments are not limited thereto. The planarization layer 270 may planarize an upper surface of the substrate 100, and may include an organic insulating material, but embodiments are not limited thereto.

The first electrode 300 may be patterned on the circuit device layer 200, and for example, may be patterned on the planarization layer 270 in each of a plurality of subpixels P1 and P2. The first electrode 300 in each of the subpixels P1 and P2 may include a first sub-electrode 310 and a second sub-electrode 320. The first sub-electrode 310 may be directly connected to the drain electrode 250 of the driving TFT via a first contact hole CH1, which may be in the passivation layer 260 and the planarization layer 270. The second sub-electrode 320 may be directly connected to the same drain electrode 250 of the driving TFT via a second contact hole CH2, which may be in the passivation layer 260 and the planarization layer 270. The first contact hole CH1 and the second contact hole CH2 may be provided at different positions, and may expose different regions of the drain electrode 250. However, the first sub-electrode 310 may be directly connected to the source electrode 240 of the driving TFT via the first contact hole CH1, which may be in the passivation layer 260 and the planarization layer 270, and the second sub-electrode 320 may be directly connected to the same source electrode 240 of the driving TFT via the second contact hole CH2, which may be in the passivation layer 260 and the planarization layer 270.

The first sub-electrode 310 may include a first bottom electrode 311 and a first top electrode 312. The first bottom electrode 311 may be directly connected to the drain electrode 250 or the source electrode 240 of the driving TFT via the first contact hole CH1, and the first top electrode 312 may be on the first bottom electrode 311.

The first bottom electrode 311 may function as an auxiliary electrode, which may connect the first top electrode 312 to the drain electrode 250, or may connect the first top electrode 312 to the source electrode 240. The first top electrode 312 may function as an anode electrode, which may generate a hole. Therefore, the first bottom electrode 311 may include a material that may be good in electrical conductivity. The first top electrode 312 may include a material that may have a good hole-generating characteristic.

Both ends of the first top electrode 312 may match both ends of the first bottom electrode 311. For example, a bottom surface of the first top electrode 312 may be the same length as (or coextensive with) a top surface of the first bottom electrode 311. Also, a lower surface of the first top electrode 312 may contact an upper surface of the first bottom electrode 311. However, the whole lower surface of the first top electrode 312 may not contact the upper surface of the first bottom electrode 311, and only a portion of the lower surface of the first top electrode 312 may contact the upper surface of the first bottom electrode 311. For example, the first filling layer 410 may be provided between the first top electrode 312 and the first bottom electrode 311. Thus, the lower surface of the first top electrode 312 may contact the first filling layer 410 in a region in which the first filling layer 410 may be provided.

The first filling layer 410 may be provided in the first contact hole CH1, and may be filled into the first contact hole CH1 to planarize a surface of the first sub-electrode 310. The first filling layer 410 may include an organic material, but embodiments are not limited thereto.

The second sub-electrode 320 may include a second bottom electrode 321 and a second top electrode 322. The second bottom electrode 321 may be directly connected to the drain electrode 250 or the source electrode 240 of the driving TFT via the second contact hole CH2, and the second top electrode 322 may be on the second bottom electrode 321.

The second bottom electrode 321 may function as an auxiliary electrode, which may connect the second top electrode 322 to the drain electrode 250, or may connect the second top electrode 322 to the source electrode 240. The second top electrode 322 may function as an anode electrode, which may generate a hole. Therefore, the second bottom electrode 321 may include a material that may be good in electrical conductivity. The second top electrode 322 may include a material that may be have a good hole-generating characteristic.

Both ends of the second top electrode 322 may match both ends of the second bottom electrode 321. For example, a bottom surface of the second top electrode 322 may be the same length as (or coextensive with) a top surface of the second bottom electrode 321. Also, a lower surface of the second top electrode 322 may contact an upper surface of the second bottom electrode 321. However, the whole lower surface of the second top electrode 322 may not contact the upper surface of the second bottom electrode 321, and only a portion of the lower surface of the second top electrode 322 may contact the upper surface of the second bottom electrode 321. For example, the second filling layer 420 may be provided between the second top electrode 322 and the second bottom electrode 321. Thus, the lower surface of the second top electrode 322 may contact the second filling layer 420 in a region in which the second filling layer 420 may be provided.

The second filling layer 420 may be provided in the second contact hole CH2, and may be filled into the second contact hole CH2 to planarize a surface of the second sub-electrode 320. The second filling layer 420 may include the same material as that of the first filling layer 410, but embodiments are not limited thereto.

The second bottom electrode 321 may be spaced apart from the first bottom electrode 311 and the first top electrode 312. The second bottom electrode 321 may include the same material as that of the first bottom electrode 311, but embodiments are not limited thereto. A thickness of the second bottom electrode 321 may be equal to that of the first bottom electrode 311 so that there may be no height difference between the first sub-electrode 310 and the second sub-electrode 320, but embodiments are not limited thereto.

The second top electrode 322 may be spaced apart from the first bottom electrode 311 and the first top electrode 312. The second top electrode 322 may include the same material as that of the first top electrode 312, but embodiments are not limited thereto. A thickness of the second top electrode 322 may be equal to that of the first top electrode 312 so that there may be no height difference between the first sub-electrode 310 and the second sub-electrode 320, but embodiments are not limited thereto.

A thickness of the second bottom electrode 321 may be equal to that of the first bottom electrode 311, and a thickness of the second top electrode 322 may be equal to that of the first top electrode 312. Thus, a height of an upper surface of the first sub-electrode 310 may be equal to that of an upper surface of the second sub-electrode 320. However, embodiments are not limited thereto.

In each of the subpixels P1 and P2, although the first sub-electrode 310 and the second sub-electrode 320 may be spaced apart from each other, the first sub-electrode 310 and the second sub-electrode 320 may be connected to the drain electrode 250 or the source electrode 240 in common. Therefore, the same signal may be simultaneously supplied to the first sub-electrode 310 and the second sub-electrode 320 of each of the subpixels P1 and P2.

The light-emitting layer 500 may be on the first electrode 300. The light emitting layer 500 may be provided in a boundary region between the plurality of subpixels P1 and P2.

According to an embodiment of the present disclosure, a separate bank may not be provided in a boundary between the subpixels P1 and P2. Therefore, a whole upper surface of the first electrode 300 may be covered by the light-emitting layer 500, and may contact a lower surface of the light-emitting layer 500. For example, a whole upper surface of each of the first sub-electrode 310 and the second sub-electrode 320 may contact a lower surface of the light-emitting layer 500.

Moreover, because the separate bank may be not provided in the boundary between the subpixels P1 and P2, the first electrode 300 of the first subpixel P1 and the first electrode 300 of the second subpixel P2 may face each other with the light-emitting layer 500 therebetween. For example, one side surface of each of the first electrode 300 of the first subpixel P1 and the first electrode 300 of the second subpixel P2, which may face each other, may contact the light-emitting layer 500.

For example, the second sub-electrode 320 of the first subpixel P1 and the first sub-electrode 310 of the second subpixel P2 may face each other with the light-emitting layer 500 therebetween. One side surface of each of the second sub-electrode 320 of the first subpixel P1 and the first sub-electrode 310 of the second subpixel P2, which may face each other, may contact the light-emitting layer 500.

The light-emitting layer 500 may emit white (W) light. For example, the light-emitting layer 500 may include a plurality of stacks that may emit light of different colors. For example, the light-emitting layer 500 may include a first stack 510, a second stack 530, and a charge generating layer (CGL) 520 between the first stack 510 and the second stack 530.

The first stack 510 may have a structure in which a hole injecting layer (HIL), a hole transporting layer (HTL), and a blue (B) emitting layer (EML(B)) may be sequentially stacked. However, embodiments are not limited thereto.

The charge generating layer 520 may be between the first stack 510 and the second stack 530, and may provide an electric charge to the first stack 510 and the second stack 530. The charge generating layer 520 may include an N-type charge generating layer for providing an electron to the first stack 510, and a P-type charge generating layer for providing a hole to the second stack 530.

The second stack 530 may be on the charge generating layer 520, and may have a structure in which a hole transporting layer (HTL), a yellowish-green (YG) emitting layer (EML(YG)), an electron transporting layer (ETL), and an electron injecting layer (EIL) may be sequentially stacked. However, embodiments are not limited thereto.

A stacked structure of the first stack 510 and the second stack 530 may be changed to various structures known to those skilled in the art. Also, a wavelength of light emitted from each of the first stack 510 and the second stack 530 may be changed to various structures known to those skilled in the art.

The second electrode 600 may be on the light-emitting layer 500. The second electrode 600 may function as a cathode of the electroluminescent display apparatus. The second electrode 600 may be provided in each of the subpixels P1 and P2, and in a boundary region therebetween.

When the electroluminescent display apparatus according to an embodiment of the present disclosure is implemented as the top-emission type, the second electrode 600 may include a transparent conductive material for transmitting light, emitted from the light-emitting layer 500, toward an upper portion. Also, the second electrode 600 may be a semitransparent electrode. Thus, a micro-cavity effect may be obtained for each of the subpixels P1 and P2. When the second electrode 600 is a semitransparent electrode, reflection and re-reflection of light may be repeated between the second electrode 600 and the first electrode 300. Thus, the micro-cavity effect may be obtained, thereby enhancing light efficiency.

The encapsulation layer 700 may be on the second electrode 600, and may reduce or prevent external water from penetrating into the light-emitting layer 500. The encapsulation layer 700 may include an inorganic insulating material, or may have a structure in which an inorganic insulating material and an organic insulating material are alternately stacked, but embodiments are not limited thereto.

The color filter layers 810 and 820 may be on the encapsulation layer 700. The color filter layers 810 and 820 may include a first color filter 810 in the first subpixel P1 and a second color filter 820 in the second subpixel P2. The first color filter 810 may be a color filter having one color among red, green, and blue. The second color filter 820 may be a color filter having another color among red, green, and blue. Although not shown, a third subpixel adjacent to the second subpixel P2 may be additionally provided, and the third subpixel may include a third color filter that may emit light having yet another color among red, green, and blue. Also, a black matrix may be additionally provided between the color filter layers 810 and 820, and may reduce or prevent light from being leaked in the boundary between the subpixels P1 and P2. Embodiments are not limited to these colors.

FIGS. 3A to 3K are manufacturing process cross-sectional views of an electroluminescent display apparatus according to an embodiment of the present disclosure.

Figure 3B:
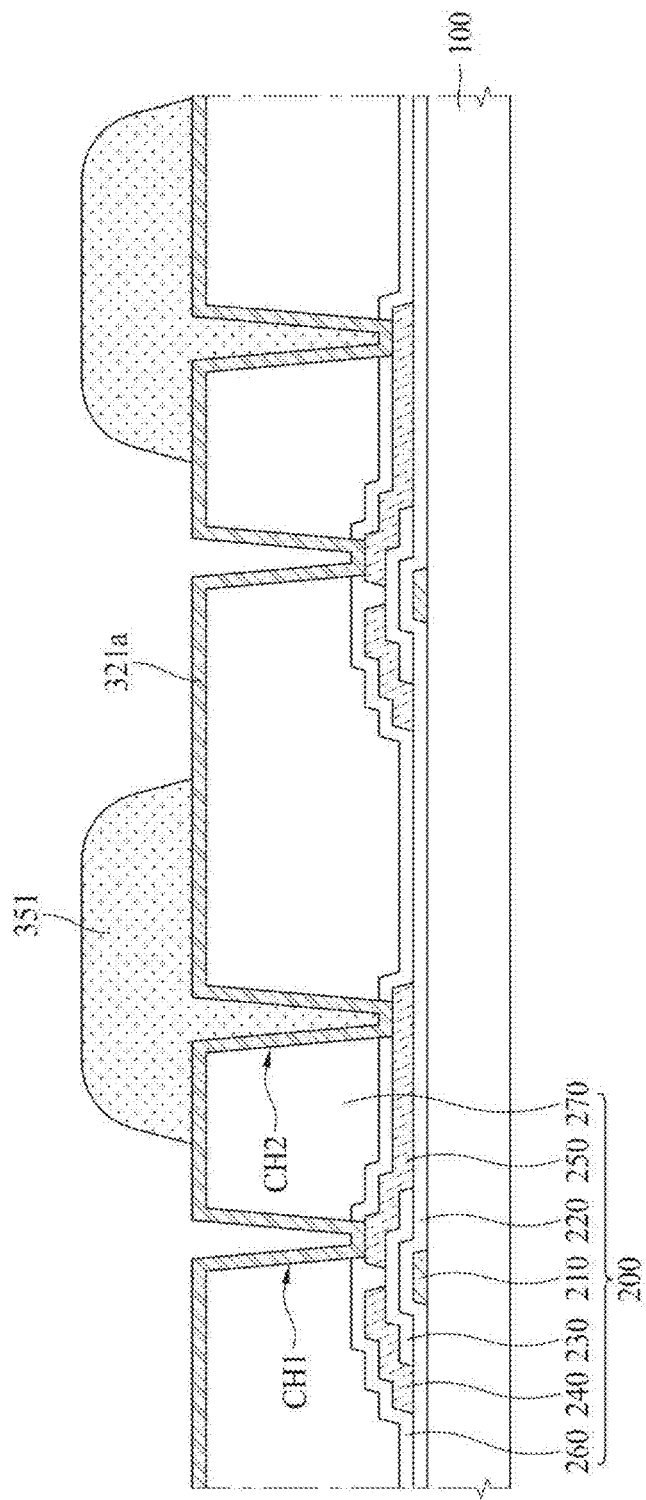

FIGS. 3A to 3K correspond to a cross-sectional surface taken along line I-I of FIG. 1. First, as seen in the example of FIG. 3A, a gate electrode 210 may be formed on a substrate 100, a gate insulation layer 220 may be formed on the gate electrode 210, a semiconductor layer 230 may be formed on the gate insulation layer 220, a source electrode 240 and a drain electrode 250 may be formed on the semiconductor layer 230 to face each other, a passivation layer 260 may be formed on the source electrode 240 and the drain electrode 250, and a planarization layer 270 may be formed on the passivation layer 260.

Subsequently, a first contact hole CH1 and a second contact hole CH2 may be formed by removing a certain region of the passivation layer 260 and a certain region of the planarization layer 270. Depending on the case, the source electrode 240 may be exposed by forming the first contact hole CH1 and the second contact hole CH2.

Subsequently, as seen in the example of FIG. 3B, a second bottom electrode layer 321a, connected to the drain electrode 250 or the source electrode 240 via the first contact hole CH1 and the second contact hole CH2, may be formed on an entire surface of the planarization layer 270. A first photoresist 351 may be formed on the second bottom electrode layer 321a.

For example, the first photoresist 351 may overlap the second contact hole CH2 and may not overlap the first contact hole CH1. Therefore, a certain region of the second bottom electrode layer 321a overlapping the first contact hole CH1 may be exposed without being covered by the first photoresist 351.

Figure 3C:
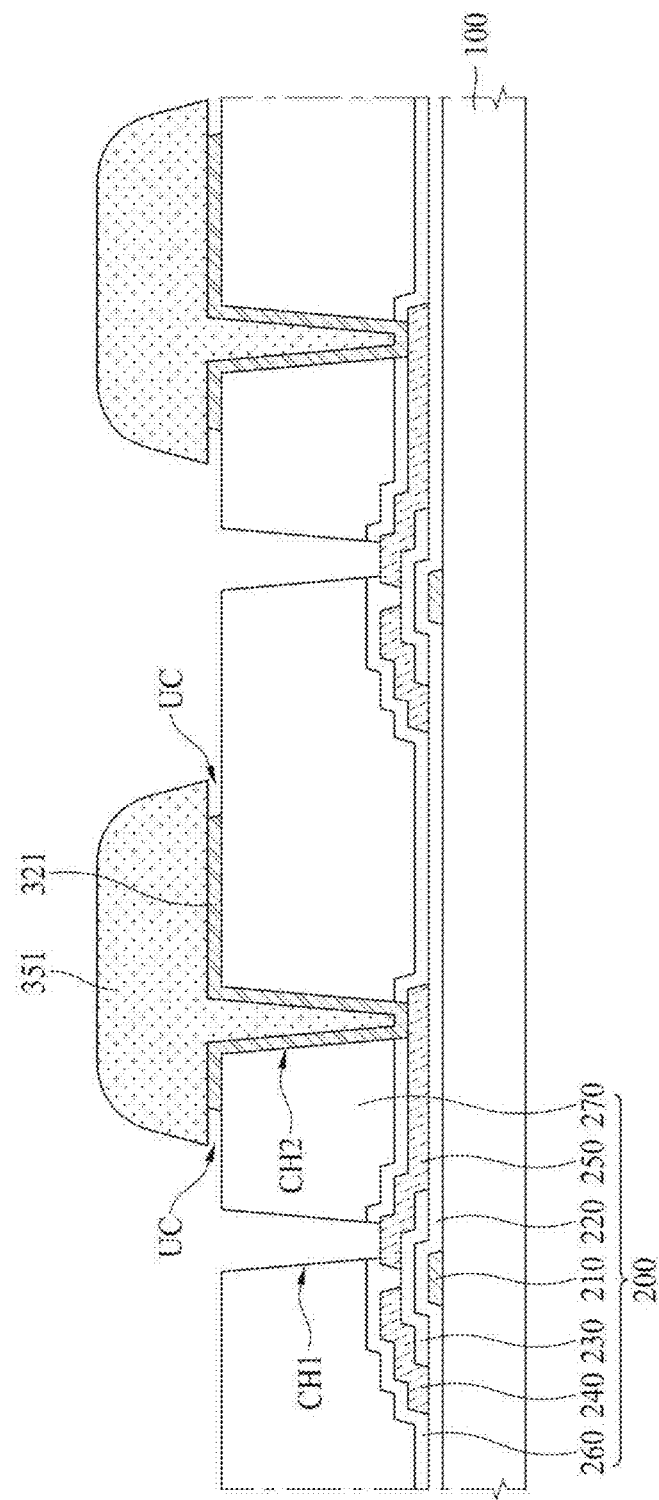

Subsequently, as seen in the example of FIG. 3C, a certain region of the second bottom electrode layer 321a may be removed by using the first photoresist 351 as a mask. Therefore, a partial region of the second bottom electrode layer 321a under the first photoresist 351 may remain. Thus, a second bottom electrode 321 connected to the drain electrode 250 or the source electrode 240 may be formed. Also, the planarization layer 270 may be exposed at a portion from which the certain region of the second bottom electrode layer 321a may be removed, and the drain electrode 250 or the source electrode 240 may be exposed via the first contact hole CH1. At this time, an undercut UC may be formed under both ends of the first photoresist 351.

Figure 3D:
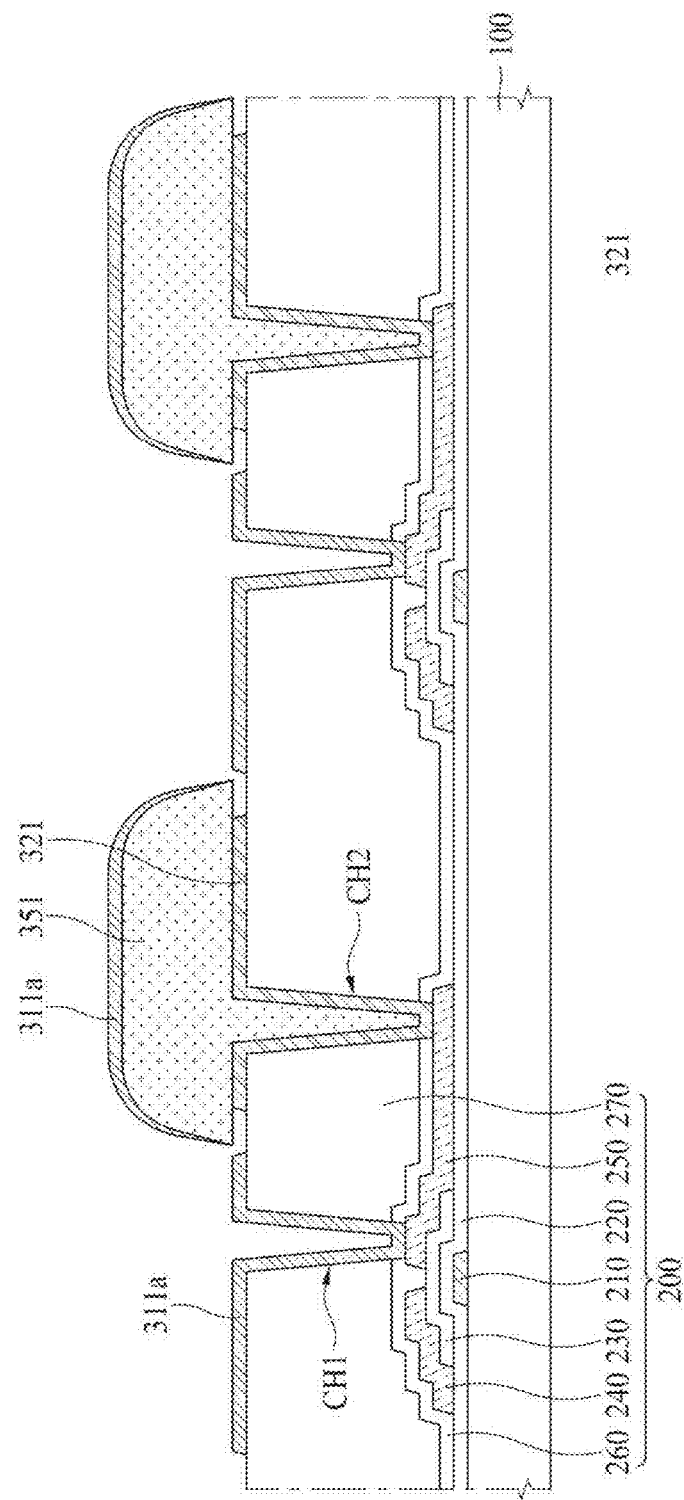

Subsequently, as seen in the example of FIG. 3D, a first bottom electrode layer 311a may be formed on an upper surface of the first photoresist 351 and the exposed planarization layer 270. For example, the first bottom electrode layer 311a may be connected to the drain electrode 250 or the source electrode 210 via the first contact hole CH1. The first bottom electrode layer 311a may be spaced apart from the second bottom electrode 321 by the undercut without being connected thereto.

Figure 3E:
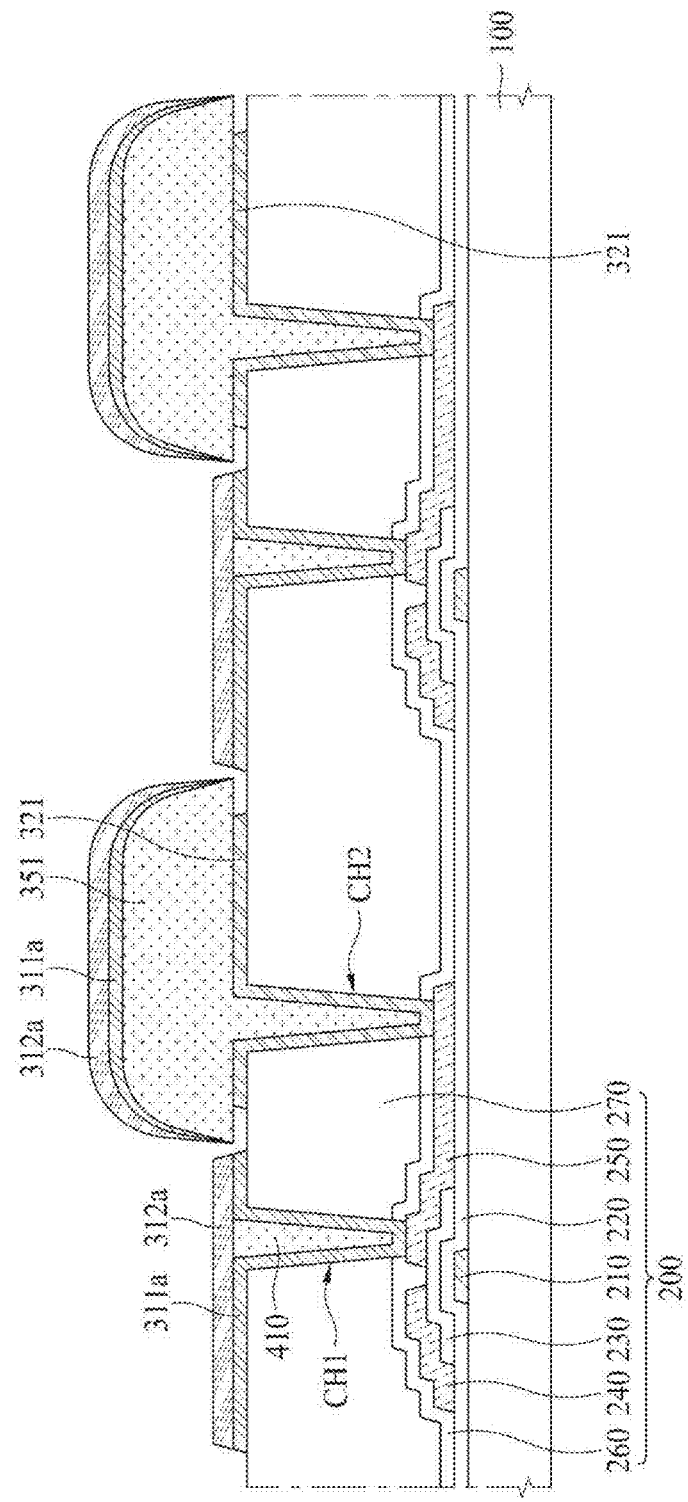

Subsequently, as seen in the example of FIG. 3E, a first filling layer 410 may be formed on the first bottom electrode layer 311a overlapping the first contact hole CH1. Subsequently, a first top electrode layer 312a may be formed on the first bottom electrode layer 311a and the first filling layer 410.

Subsequently, as seen in the example of FIG. 3F, the first photoresist 351, and the first bottom electrode layer 311a and the first top electrode layer 312a, each provided on the first photoresist 351, may be removed. Therefore, a first sub-electrode 310, including a first bottom electrode 311 and a first top electrode 312, may be formed.

Figure 3G:
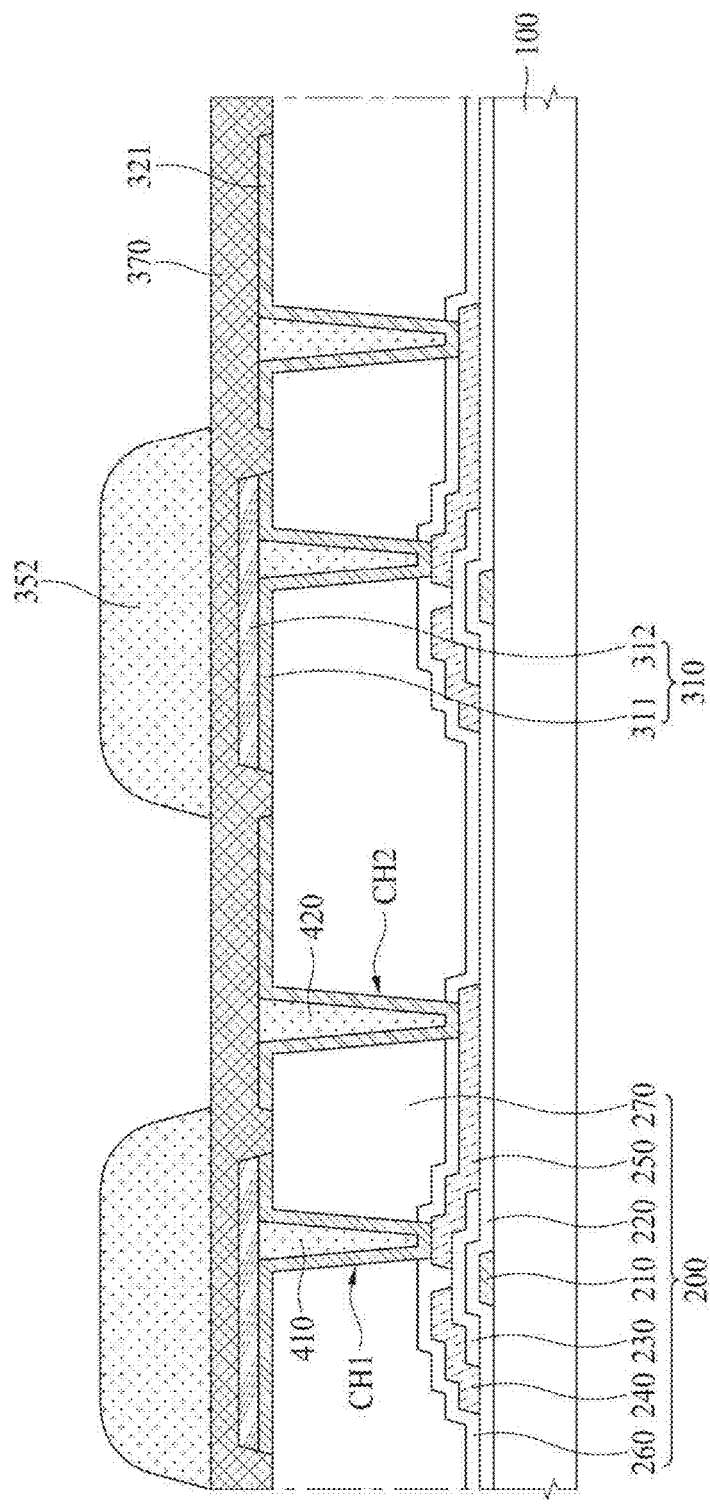

Subsequently, as seen in the example of FIG. 3G, a second filling layer 420 may be formed on the second bottom electrode 312 overlapping the second contact hole CH2. Subsequently, a sacrificial layer 370 may be formed on the first sub-electrode 310, the second bottom electrode 321, and the second filling layer 420, and a second photoresist 352 may be formed on the sacrificial layer 370.

For example, the second photoresist 352 may overlap the first contact hole CH1 and may not overlap the second contact hole CH2. Therefore, a certain region of the sacrificial layer 370, overlapping the second contact hole CH2, may be exposed without being covered by the second photoresist 352.

Figure 3H:
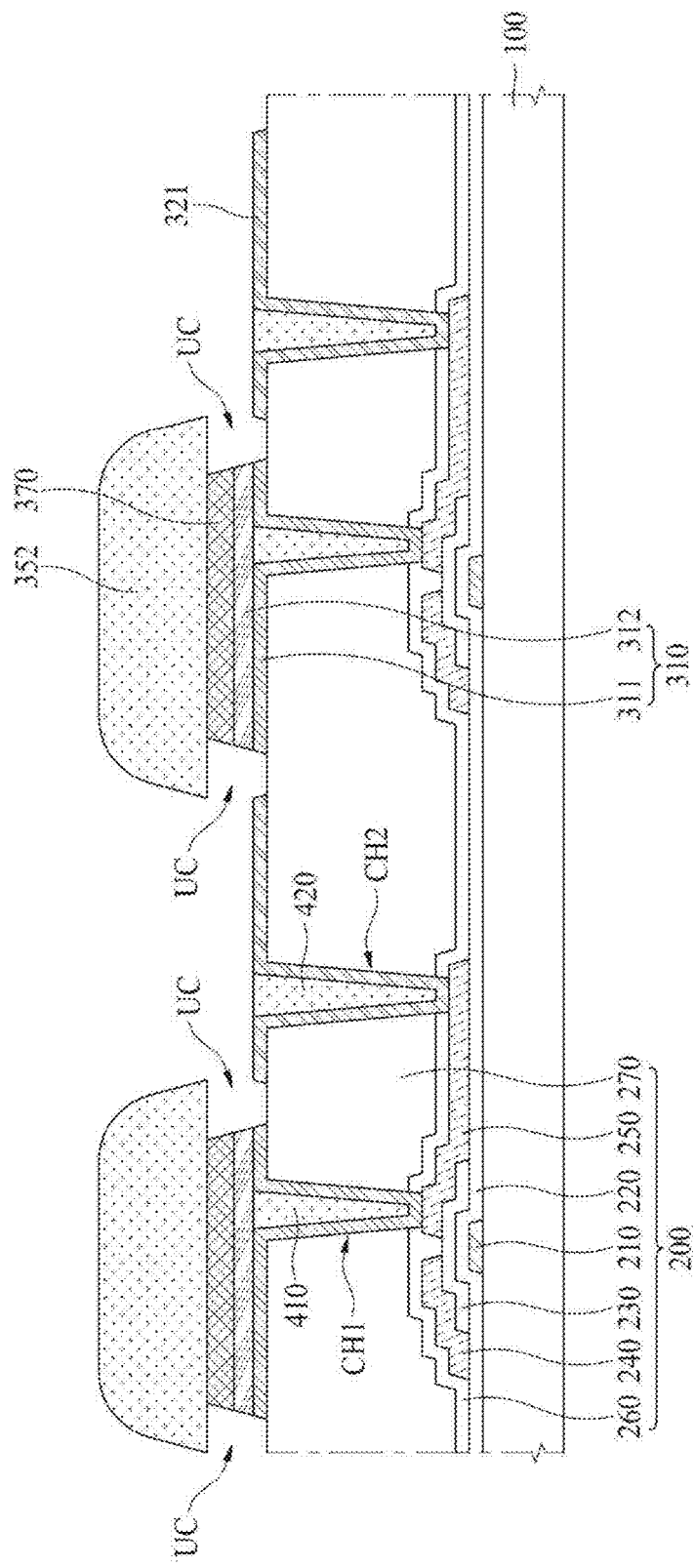

Subsequently, as seen in the example of FIG. 3H, a certain region of the sacrificial layer 370 may be removed by using the second photoresist 352 as a mask. Therefore, the second bottom electrode 321 and the second filling layer 420 may be exposed at a portion form which the sacrificial layer 370 may be removed. At this time, an undercut UC may be formed under both ends of the second photoresist 352. The sacrificial layer 370, which may be formed in the above-described process of FIG. 3G, may enable the undercut UC to be formed under both ends of the second photoresist 352.

Subsequently, as seen in the example of FIG. 3I, a second top electrode layer 322a may be formed on an upper surface of the second photoresist 352, the exposed second bottom electrode 321, and the second filling layer 420. For example, the second top electrode layer 322a may be connected to the first sub-electrode 310 by the undercut UC.

Figure 3J:
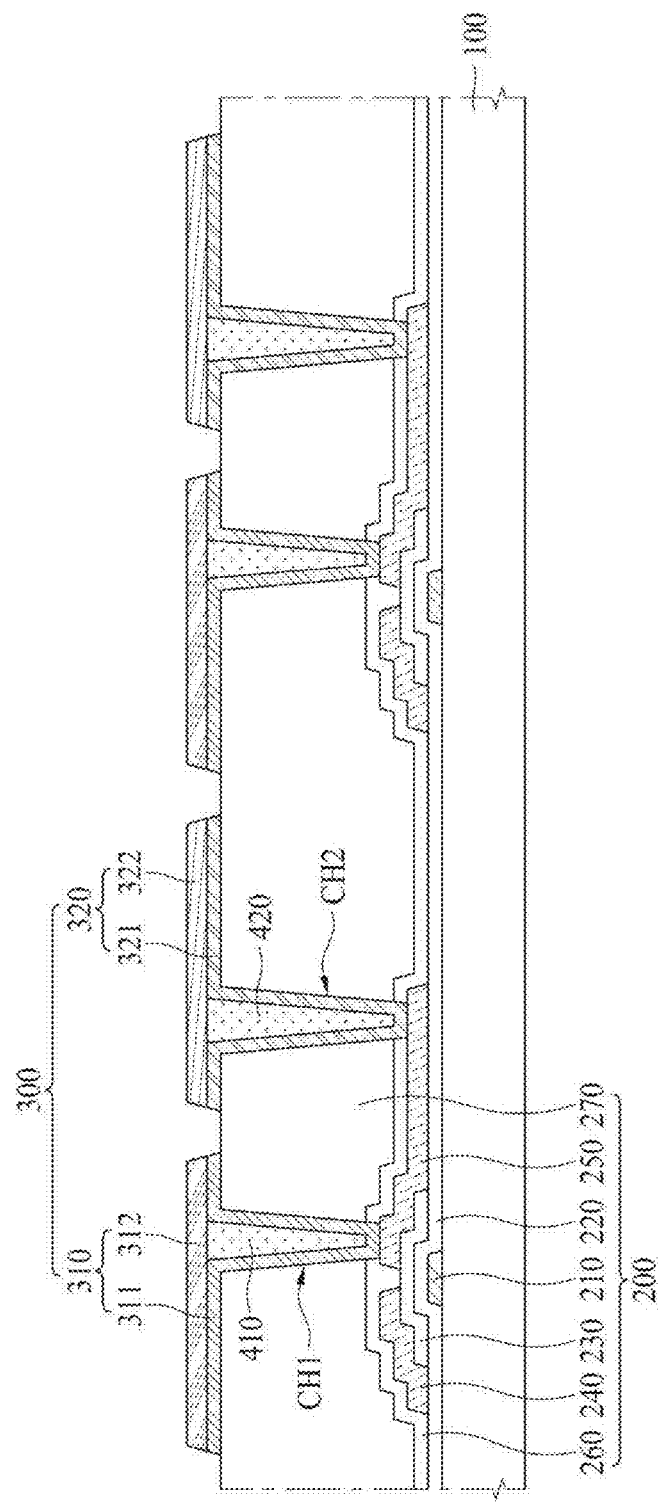

Subsequently, as seen in the example of FIG. 3J, the second photoresist 352, and the second top electrode layer 322a on the second photoresist 352, may be removed. Therefore, a second sub-electrode 320, including a second bottom electrode 321 and a second top electrode 322, may be formed.

Figure 3K:
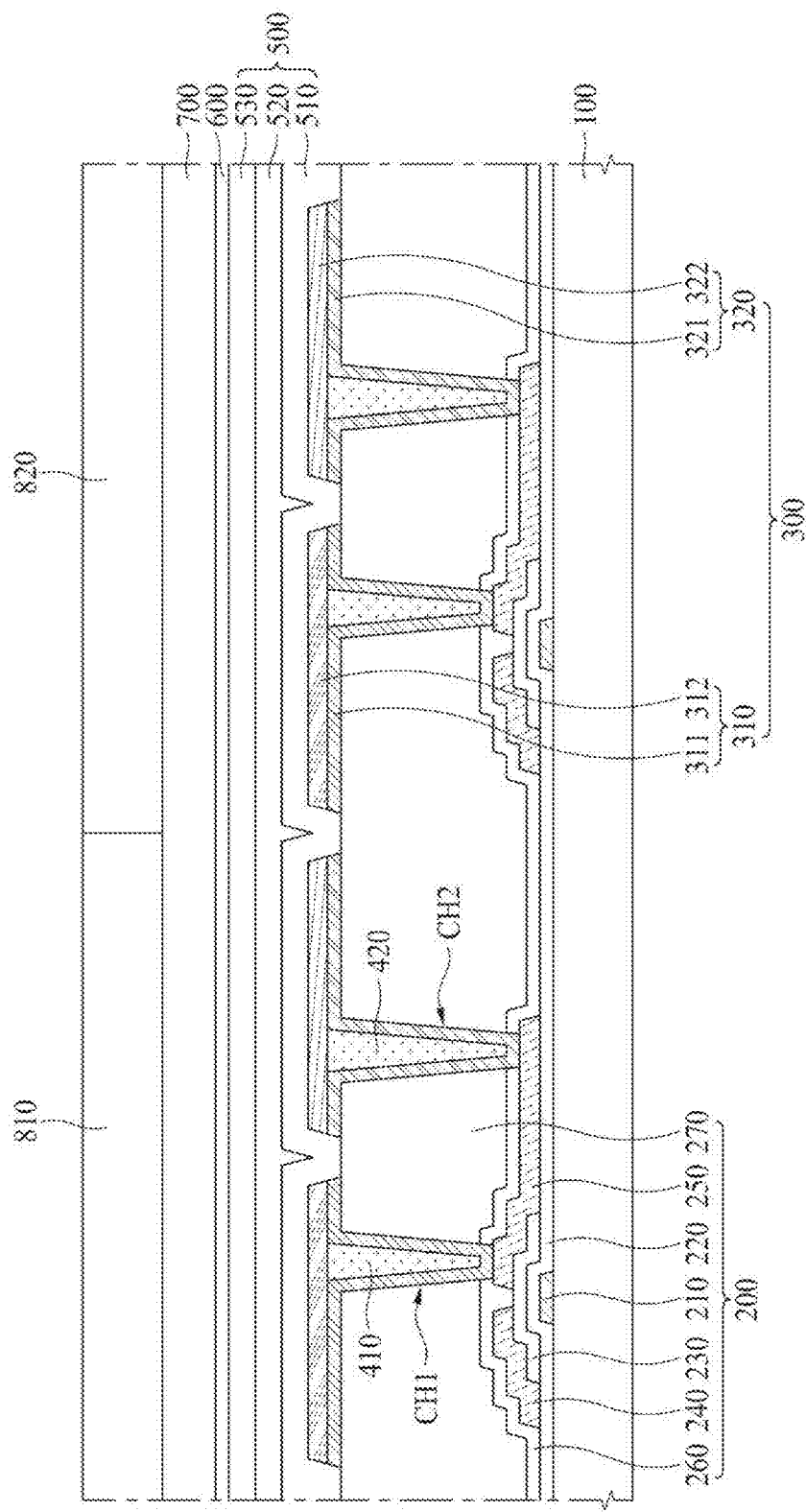

Subsequently, as seen in the example of FIG. 3K, a light-emitting layer 500, including a first stack 510, a charge generating layer 520, and a second stack 530, may be formed on the first sub-electrode 310 and the second sub-electrode 320. Subsequently, a second electrode 600 may be formed on the light-emitting layer 500, an encapsulation layer 700 may be formed on the second electrode 600, and a plurality of color filter layers 810 and 820 may be formed on the encapsulation layer 700, thereby implementing the electroluminescent display apparatus of FIG. 2 described above.

Figure 4:
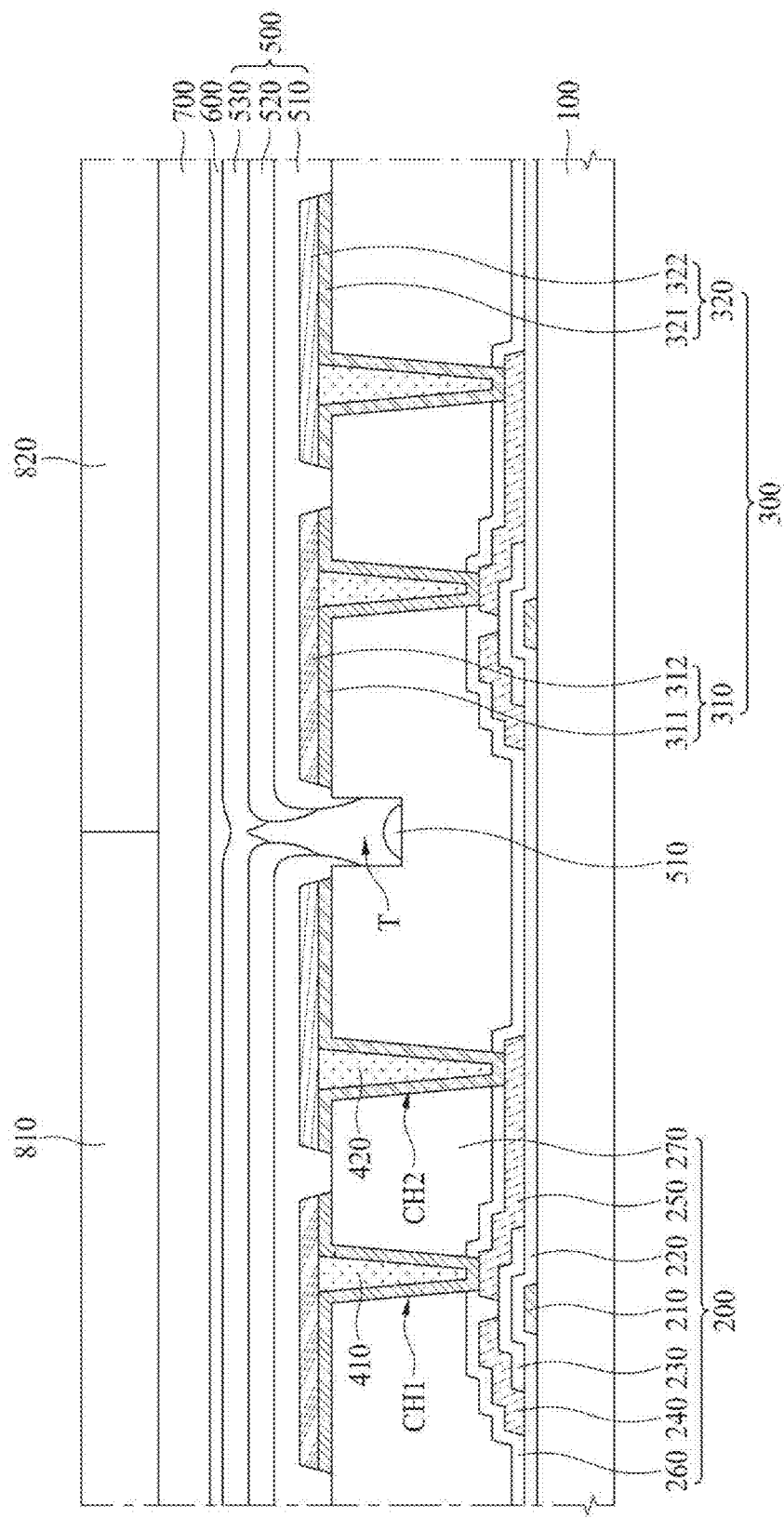
FIG. 4 is a cross-sectional view of an electroluminescent display apparatus according to an embodiment of the present disclosure.

FIG. 4 is a cross-sectional view of an electroluminescent display apparatus according to an embodiment of the present disclosure.

Except for a trench T being formed in the circuit device layer 200 and at least a portion of a light-emitting layer 500 being disconnected in the trench T region, the electroluminescent display apparatus of FIG. 4 is substantially similar to the electroluminescent display apparatus of FIG. 2. Therefore, like reference numerals refer to like elements throughout, and only different elements will be described below.

As seen in the example of FIG. 4, a trench T may be provided in a planarization layer 270 of a circuit device layer 200. The trench T may be provided in a boundary between a first subpixel P1 and a second subpixel P2. The trench T may reduce or prevent a leakage current from occurring between adjacent subpixels P1 and P2, thereby decreasing a leakage current occurring between the subpixels P1 to P3.

When an interval between the subpixels P1 and P2 is very short for realizing a high resolution, and when light may be emitted from a light-emitting layer in one of the subpixels P1 and P2, there may be a possibility that an electric charge in the light-emitting layer 500 may move to an adjacent subpixel to cause a leakage current. Therefore, in an embodiment of the present disclosure, the trench T may be in the boundary between the subpixels P1 and P2. A portion of the light-emitting layer 500 in the trench T may be disconnected (e.g., noncontiguous), thereby decreasing a leakage current occurring between the subpixels P1 and P2 adjacent to each other.

The light-emitting layer 500 may be in the trench T, and may be above the trench T. According to an embodiment of the present disclosure, at least a portion of the light-emitting layer 500 may be disconnected (e.g., may be noncontiguous) in the trench T or above the trench T, thereby reducing or preventing a leakage current from occurring between the subpixels P1 and P2 adjacent to each other.

A first stack 510 may be provided on an inner side surface of the trench T, and moreover, may be provided on an inner lower surface of the trench T. For example, a portion of the first stack 510 on the inner side surface of the trench T may be disconnected from (e.g., noncontiguous with) a portion of the first stack 510 on the inner lower surface of the trench T. Therefore, a portion of the first stack 510 on one side surface (for example, a left surface) of an inner portion of the trench T may be disconnected from (e.g., noncontiguous with) a portion of the first stack 510 on the other side surface (for example, a right surface) of the inner portion of the trench T. Accordingly, an electric charge may not move, through the first stack 510, between the subpixels P1 and P2 which may be adjacent to each other with the trench T therebetween. It should be appreciated that the terms "left" and "right" are used herein for convenience, and are interchangeable as would be understood by one of ordinary skill in the art.

A charge generating layer 520 may be on the first stack 510 on the inner side surface of the trench T, or may be on the first stack 510 above the trench T without extending into the trench T. For example, a portion of the charge generating layer 520 on the one side surface (for example, the left surface) of the inner portion of the trench T may be disconnected from (e.g., noncontiguous with) a portion of the charge generating layer 520 on the other side surface (for example, the right surface) of the inner portion of the trench T. Accordingly, an electric charge may not move through the charge generating layer 520 between the subpixels P1 and P2, which may be adjacent to each other with the trench T therebetween.

A second stack 530 may connect between the subpixels P1 and P2, which may be adjacent to each other with the trench T therebetween on the charge generating layer 520. Therefore, an electric charge may move through the second stack 530 between the subpixels P1 and P2, which may be adjacent to each other with the trench T therebetween. However, embodiments are not limited thereto. For example, by appropriately adjusting a shape of the trench T and a deposition process performed on the light-emitting layer 500, the second stack 530 may be disconnected (e.g., noncontiguous) between the subpixels P1 and P2, which may be adjacent to each other with the trench T therebetween. For example, only a portion of a lower portion of the second stack 530 adjacent to the charge generating layer 520 may be disconnected (e.g., noncontiguous) in a region between the subpixels P1 and P2.

The charge generating layer 520 may be higher in conductivity than the first stack 510 and the second stack 530. For example, an N-type charge generating layer configuring the charge generating layer 520 may include a metal material, and thus, may be higher in conductivity than the first stack 510 and the second stack 530. Therefore, the movement of an electric charge between the subpixels P1 and P2 adjacent to each other may be performed through the charge generating layer 520, and the amount of electric charges moving through the second stack 530 may be very small.

Therefore, in an embodiment of the present disclosure, at least a portion (for example, the first stack 510 and the charge generating layer 520) of the light-emitting layer 500 may be disconnected (e.g., noncontiguous) in the trench T or above the trench T, thereby reducing or preventing the occurrence of a leakage current between the subpixels P1 and P2 adjacent to each other.

A process of forming the trench T in the planarization layer 270 may be additionally performed before the above-described process of FIG. 3K, thereby implementing the electroluminescent display apparatus of FIG. 4. Depending on the case, the electroluminescent display apparatus of FIG. 4 may be implemented by additionally performing, after the above-described process of FIG. 3J, a patterning process of decreasing a size of at least one of the first sub-electrode 310 and the second sub-electrode 320, facing each other in the boundary between the subpixels P1 and P2, to secure a region where the trench T may be provided.

Figure 5:
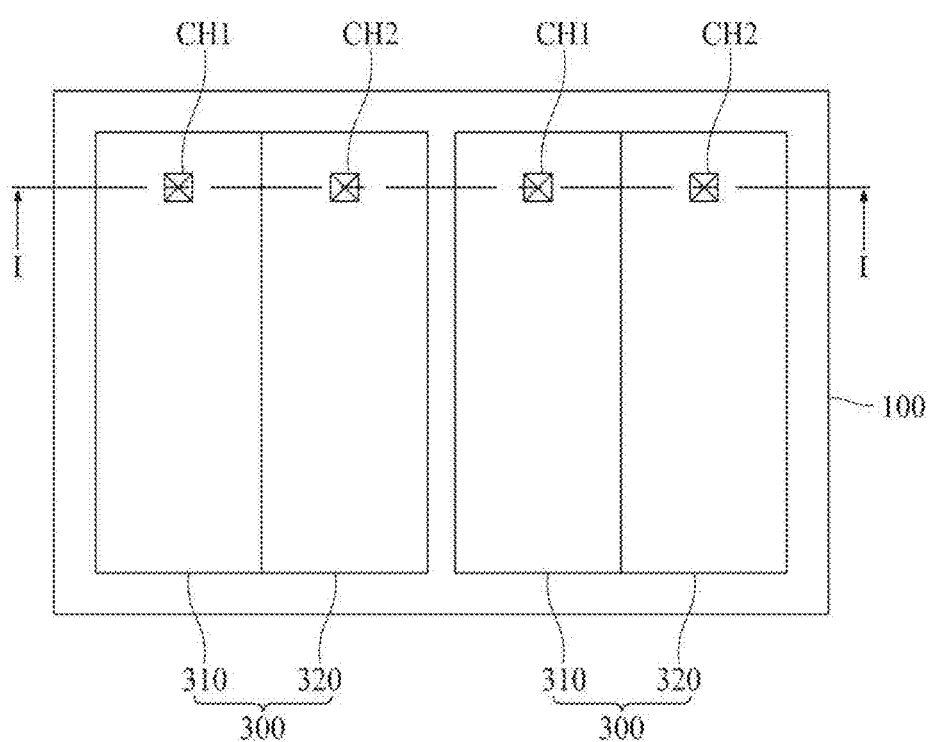
FIG. 5 is a cross-sectional view of an electroluminescent display apparatus according to an embodiment of the present disclosure.

FIG. 5 is a cross-sectional view of an electroluminescent display apparatus according to an embodiment of the present disclosure.

In FIG. 5, a first sub-electrode 310 and a second sub-electrode 320, each configuring a first electrode 300, may contact (e.g., directly contact) each other without being spaced apart from each other. In this respect, the electroluminescent display apparatus of FIG. 5 differs from the electroluminescent display apparatus of FIG. 1, and the other elements are substantially similar to those of the electroluminescent display apparatus of FIG. 1.

In an embodiment of the present disclosure illustrated in FIG. 5, the first sub-electrode 310 may contact the second sub-electrode 320. Thus, light may be smoothly emitted in a region between the first sub-electrode 310 and the second sub-electrode 320. Hereinafter, the electroluminescent display apparatus of FIG. 5 will be described in more detail with respect to a cross-sectional structure.

Figure 6:
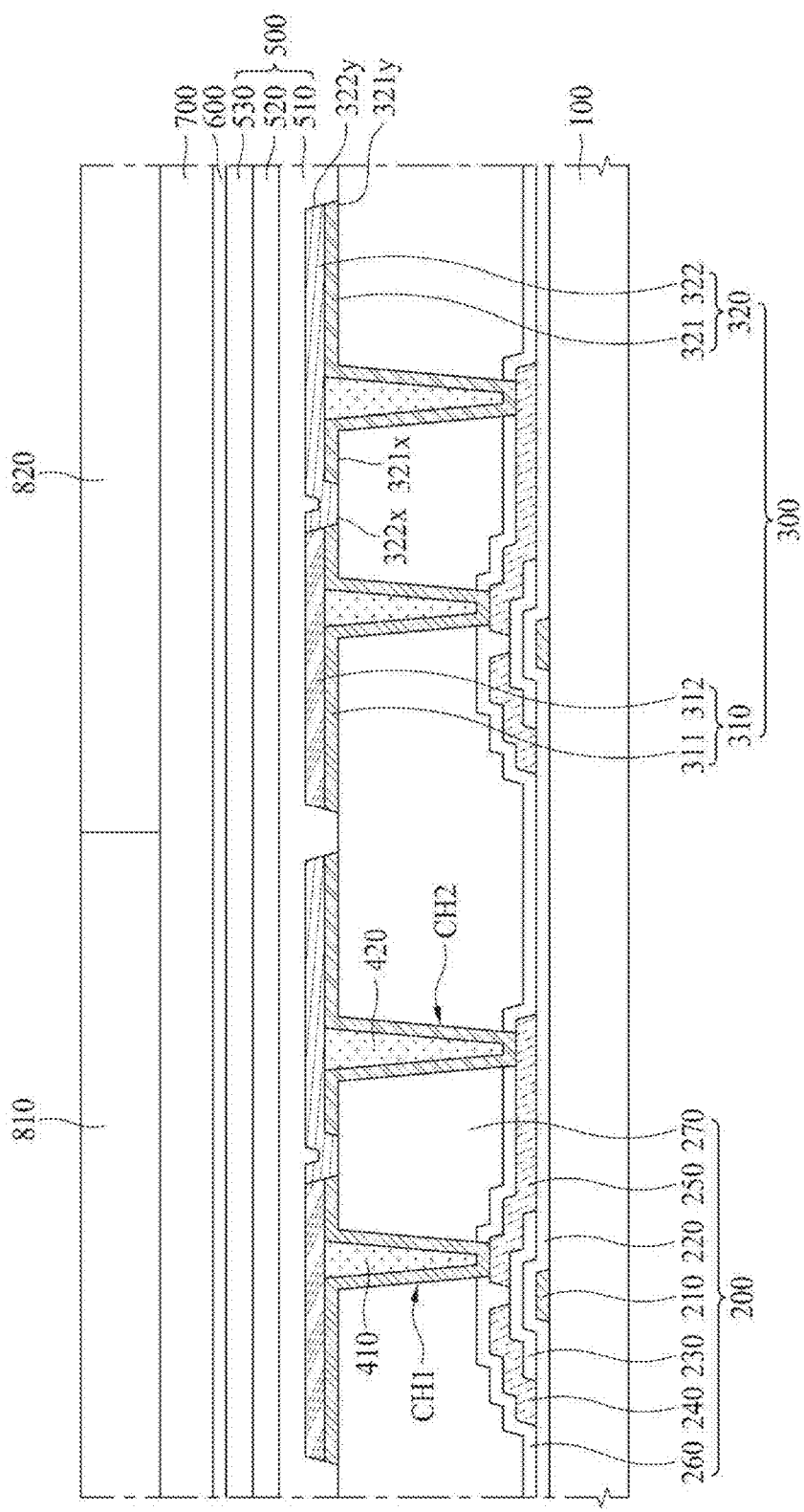
FIG. 6 is a cross-sectional view of an electroluminescent display apparatus according to an embodiment of the present disclosure.

FIG. 6 is a cross-sectional view of an electroluminescent display apparatus according to an embodiment of the present disclosure.

FIG. 6 corresponds to a cross-sectional surface taken along line I-I of FIG. 5. Except for a first sub-electrode 310 and a second sub-electrode 320 contacting each other without being spaced apart from each other, the electroluminescent display apparatus of FIG. 6 is substantially similar to the electroluminescent display apparatus of FIG. 2. Therefore, like reference numerals refer to like elements throughout, and only different elements will be described below.

As seen in the example of FIG. 6, in each of individual subpixels P1 and P2, a second bottom electrode 321, configuring the second sub-electrode 320, may be spaced apart from the first sub-electrode 310. A second top electrode 322, configuring the second sub-electrode 320, may be spaced apart from the first sub-electrode 310.

For example, the second top electrode 322 may extend to one side surface of the first bottom electrode 311 or the first top electrode 312, along an upper surface of a planarization layer 270 at an upper surface of the second bottom electrode 321, so that the second top electrode 322 may contact the first bottom electrode 311 or the first top electrode 312. Therefore, one end 322x of the second top electrode 322 may not match one end 321x of the second bottom electrode 321, and may extend more than the one end 321x of the second bottom electrode 321. However, the other end 322y of the second top electrode 322 may match the other end 321y of the second bottom electrode 321. For example, a bottom surface of the other end 322y of the second top electrode 322 may end coextensively with a top surface of the other end 321y of the second bottom electrode 321

On the other hand, both ends of the first top electrode 312 may match both ends of the first bottom electrode 311. For example, a bottom surface of the first top electrode 312 may be the same length as (or coextensive with) a top surface of the first bottom electrode 311.

The electroluminescent display apparatus of FIG. 6 may be manufactured by changing some of the above-described processes of FIGS. 3A to 3K. For example, by appropriately changing a pattern of the second photoresist pattern 352 in the above-described process of FIG. 3G, the electroluminescent display apparatus of FIG. 6 may be manufactured through a process of connecting the second top electrode layer 322a to the first sub-electrode 310 in the above-described process of FIG. 3I.

Figure 7:
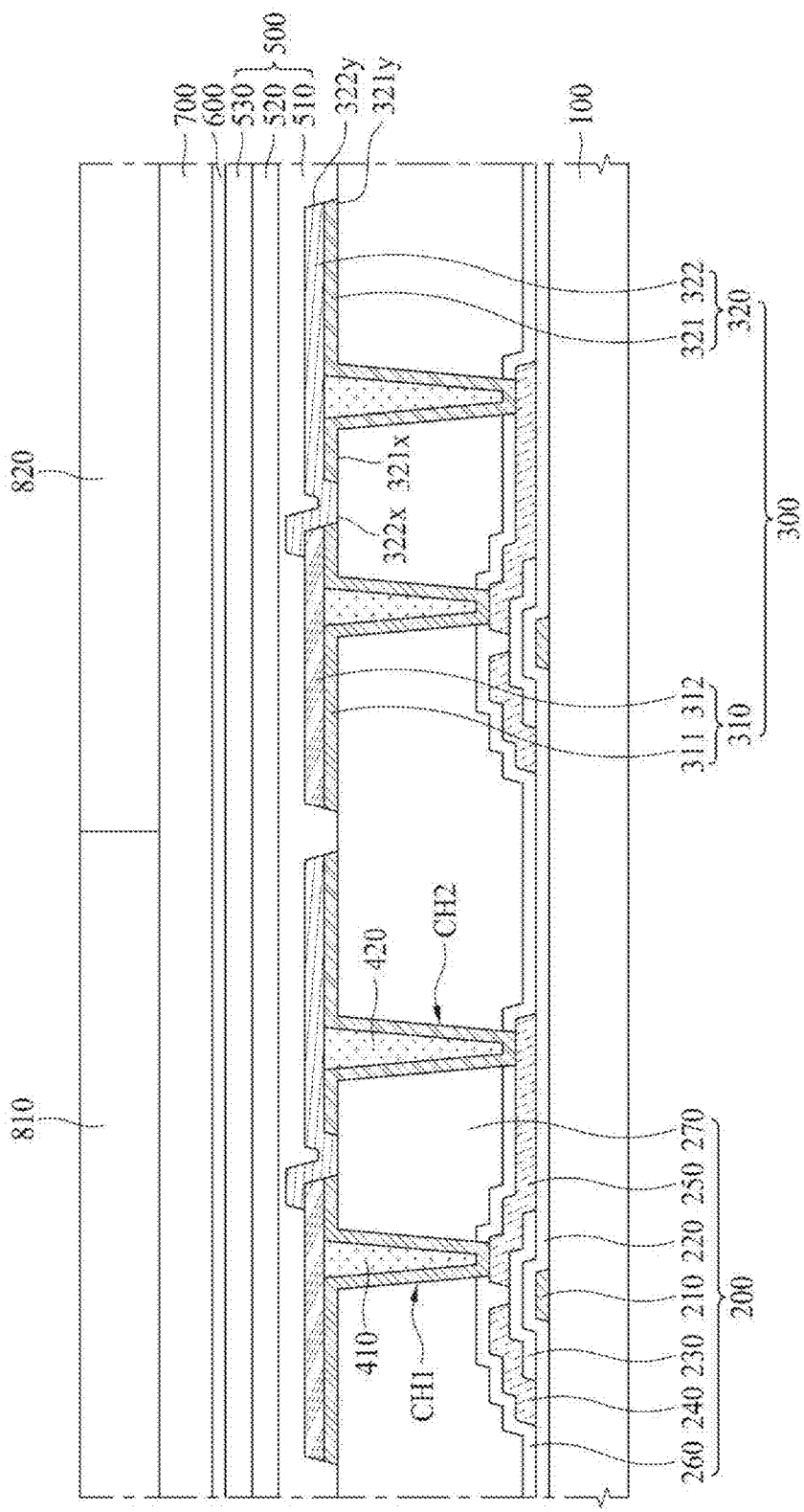
FIG. 7 is a cross-sectional view of an electroluminescent display apparatus according to an embodiment of the present disclosure.

FIG. 7 is a cross-sectional view of an electroluminescent display apparatus according to an embodiment of the present disclosure.

Except for a configuration of a second top electrode 322 configuring a second sub-electrode 320 being changed, the electroluminescent display apparatus of FIG. 7 is substantially similar to the electroluminescent display apparatus of FIG. 6. Hereinafter, therefore, only different elements will be described below.

As seen in the example of FIG. 7, one end 322x of the second top electrode 322 may extend from an upper surface of a second bottom electrode 321 to a portion of an upper surface of a first top electrode 312 along an upper surface of a planarization layer 270, one side surface of a first bottom electrode 311, and one side surface of a first top electrode 312. In the electroluminescent display apparatus of FIG. 7, the second sub-electrode 320 (e.g., the second top electrode 322) may overlap a first sub-electrode 310. Thus, even is a process error were to occur, an electrical connection between the second sub-electrode 320 and the first sub-electrode 310 may be maintained.

The electroluminescent display apparatus of FIG. 7 may be manufactured by changing some of the above-described processes of FIGS. 3A to 3K. For example, by appropriately changing a pattern of the second photoresist pattern 352 in the above-described process of FIG. 3G, the electroluminescent display apparatus of FIG. 6 may be manufactured through a process of connecting the second top electrode layer 322a to the first sub-electrode 310 in the above-described process of FIG. 3I.

Although not shown, for example, the above-described trench T of FIG. 4 may be formed in the structure of each of FIGS. 6 and 7. Thus, at least a portion of the light-emitting layer 500 may be disconnected (e.g., noncontiguous) in the trench T region.

Figure 8:
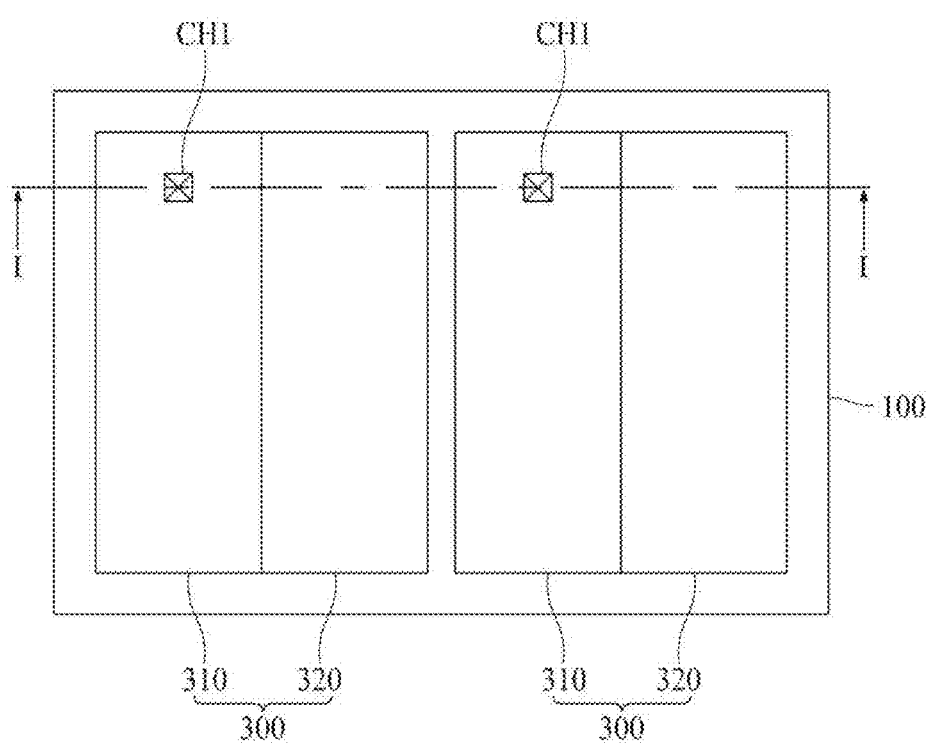
FIG. 8 is a cross-sectional view of an electroluminescent display apparatus according to an embodiment of the present disclosure.

FIG. 8 is a cross-sectional view of an electroluminescent display apparatus according to an embodiment of the present disclosure.

In the example of FIG. 8, a second contact hole CH2 may be not provided. In this respect, the electroluminescent display apparatus of FIG. 8 differs from the electroluminescent display apparatus of FIG. 5, and the other elements are substantially similar to those of the electroluminescent display apparatus of FIG. 5.

In FIG. 8, a first contact hole CH1 may be provided in a region in which the first sub-electrode 310 may be provided. Thus, the first sub-electrode 310 may be connected to a driving TFT via the first contact hole CH1. However, a second contact hole CH2 may not be provided in a region in which the second sub-electrode 320 may be provided. The second sub-electrode 320 may be connected to the first contact hole CH1. Thus, the second sub-electrode 320 may be connected to the driving TFT through the first sub-electrode 310. Therefore, the first sub-electrode 310 and the second sub-electrode 320 may be simultaneously driven by one driving TFT. Hereinafter, the electroluminescent display apparatus of FIG. 8 will be described in more detail with respect to a cross-sectional structure.

Figure 9:
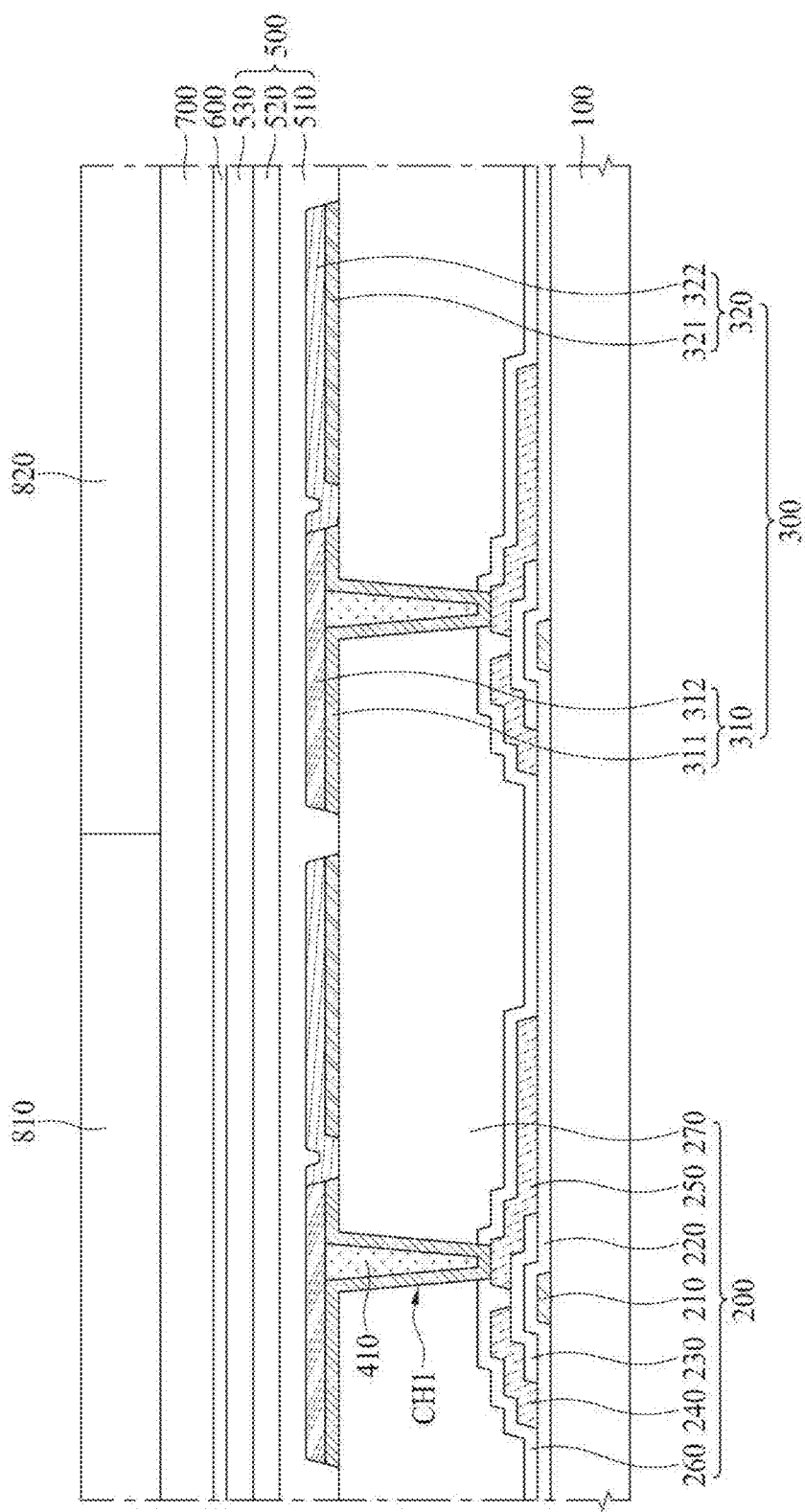
FIG. 9 is a cross-sectional view of an electroluminescent display apparatus according to an embodiment of the present disclosure.

FIG. 9 is a cross-sectional view of an electroluminescent display apparatus according to an embodiment of the present disclosure.

FIG. 9 corresponds to a cross-sectional surface taken along line I-I of FIG. 8. Except for a second contact hole CH2 and a second filling layer 420 not being provided, the electroluminescent display apparatus of FIG. 9 is substantially similar to the electroluminescent display apparatus of FIG. 6. Hereinafter, therefore, only different elements will be described below.

As seen in the example of FIG. 9, a second contact hole (e.g., second contact hole CH2 of FIG. 6 described above) may not be provided in a region overlapping a second sub-electrode 320. Therefore, because a second contact hole (see CH2 of FIG. 6 described above) may be not needed to be filled in the region overlapping the second sub-electrode 320, a second filling layer (e.g., second filling layer 420 of FIG. 6 described above) may not be provided.

Therefore, a second bottom electrode 321 configuring the second sub-electrode 320 may be provided on a flat upper surface of a planarization layer 270, and a second top electrode 322 may be provided on the second bottom electrode 321. Therefore, the second bottom electrode 321 and the second top electrode 322 may each have a flat structure. For example, a whole lower surface of the second bottom electrode 321 contacting the upper surface of the planarization layer 270 may have a flat structure.

The second sub-electrode 320 may be connected to the first sub-electrode 310. Thus, the first sub-electrode 310 and the second sub-electrode 320 may be electrically connected to the same drain electrode 240 or source electrode 230 of a driving TFT.

The electroluminescent display apparatus of FIG. 9 may be manufactured by changing some of the above-described processes of FIGS. 3A to 3K. For example, by appropriately changing a pattern of the second photoresist pattern 352 in the above-described process of FIG. 3G without the second contact hole CH2 being formed in the above-described process of FIG. 3A, and the second filling layer being formed in the above-described process of FIG. 3G, the electroluminescent display apparatus of FIG. 9 may be manufactured through a process of connecting the second top electrode layer 322a to the first sub-electrode 310 in the above-described process of FIG. 3I.

FIG. 10 is a cross-sectional view of an electroluminescent display apparatus according to an embodiment of the present disclosure.

FIG. 10 corresponds to a cross-sectional surface taken along line I-I of FIG. 8. Except for a second contact hole CH2 and a second filling layer 420 not being provided, the electroluminescent display apparatus of FIG. 10 is substantially similar to the electroluminescent display apparatus of FIG. 7. Hereinafter, therefore, only different elements will be described below.

As seen in the example of FIG. 10, a second contact hole (e.g., second contact hole CH2 of FIG. 7 described above) may not be provided in a region overlapping a second sub-electrode 320. Therefore, because a second contact hole (e.g., second contact hole CH2 of FIG. 7 described above) may be not needed to be filled in the region overlapping the second sub-electrode 320, a second filling layer (e.g., second filling layer 420 of FIG. 7 described above) may not be provided.

Therefore, a second bottom electrode 321 configuring the second sub-electrode 320 may be provided on a flat upper surface of a planarization layer 270, and a second top electrode 322 may be provided on the second bottom electrode 321. Therefore, the second bottom electrode 321 and the second top electrode 322 may each have a flat structure.

The electroluminescent display apparatus of FIG. 10 may be manufactured by changing some of the above-described processes of FIGS. 3A to 3K. For example, by appropriately changing a pattern of the second photoresist pattern 352 in the above-described process of FIG. 3G without the second contact hole CH2 being formed in the above-described process of FIG. 3A, and the second filling layer being formed in the above-described process of FIG. 3G, the electroluminescent display apparatus of FIG. 10 may be manufactured through a process of connecting the second top electrode layer 322a to the first sub-electrode 310 in the above-described process of FIG. 3I.

Figure 11A:
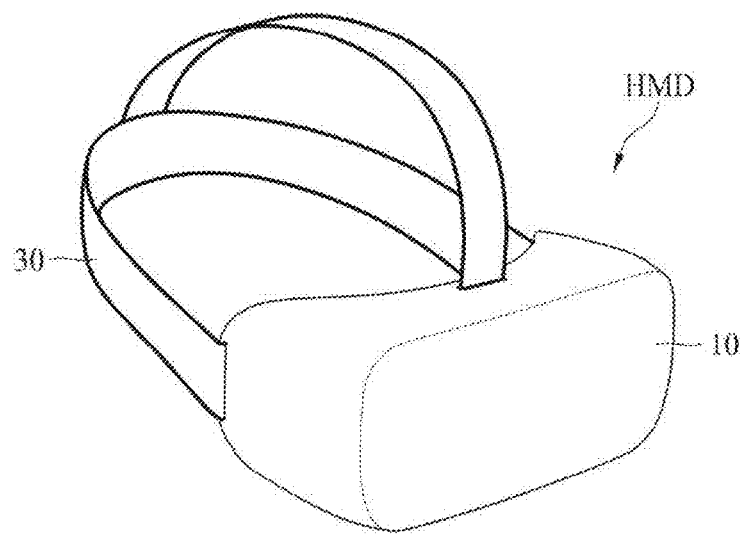
FIGS. 11A to 11C illustrate an electroluminescent display apparatus according to an embodiment of the present disclosure, which relate to a head mounted display (HMD) device.
Figure 11B:
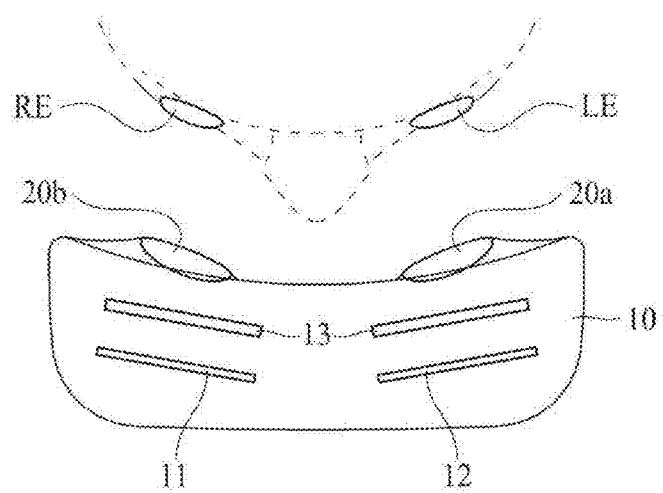
Figure 11C:
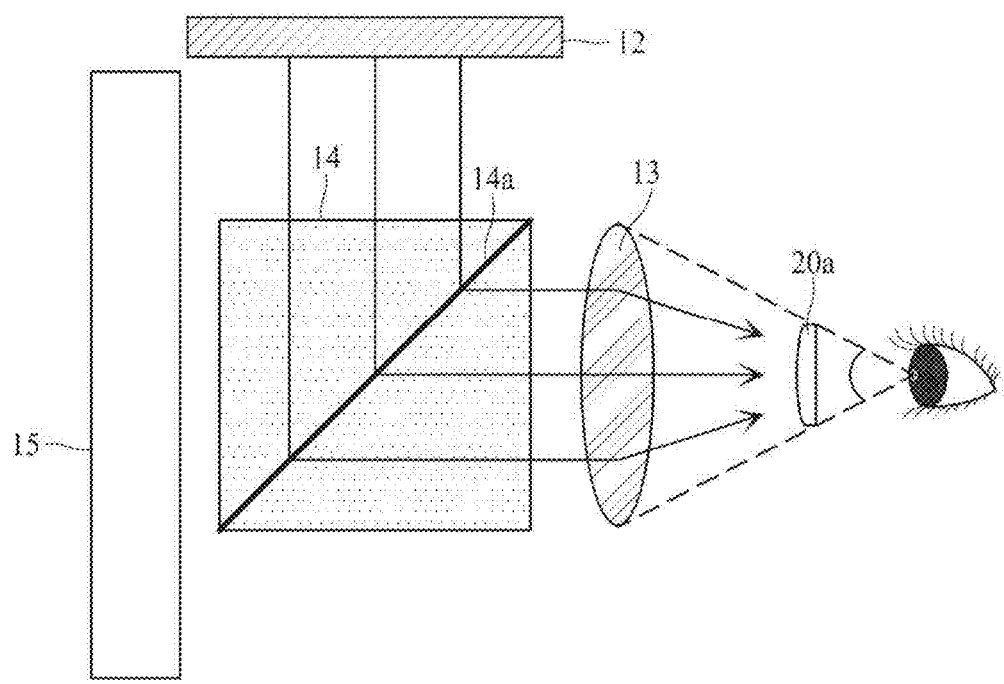

FIGS. 11A to 11C illustrate an electroluminescent display apparatus according to an embodiment of the present disclosure, which relate to a head mounted display (HIVID) device.

FIG. 11A is a perspective view. FIG. 11B is a plan view of a virtual reality (VR) structure. FIG. 11C is a cross-sectional view of an augmented reality (AR) structure.

As seen in the example of FIG. 11A, the HIVID apparatus according to the present disclosure may include an accommodating case 10 and a head-mounted band 30. The accommodating case 10 may accommodate elements, such as a display apparatus, a lens array, and an eyepiece lens.

The head-mounted band 30 may be fixed to the accommodating case 10. Although the head-mounted band 30 is illustrated as surrounding an upper surface of both side surfaces of a user, embodiments are not limited thereto. For example, the head-mounted band 30 may fix the HIVID apparatus to a head of a user, and may be replaced by a glasses frame-type structure or by a helmet-type structure.

As seen in the example of FIG. 11B, an HIVID apparatus having the VR structure according to an embodiment of the present disclosure may include a left-eye display apparatus 12, a right-eye display apparatus 11, a lens array 13, a left-eye eyepiece lens 20a, and a right-eye eyepiece lens 20b. The left-eye display apparatus 12, the right-eye display apparatus 11, the lens array 13, the left-eye eyepiece lens 20a, and the right-eye eyepiece lens 20b may be accommodated into the accommodating case 10.

The left-eye display apparatus 12 and the right-eye display apparatus 11 may display the same image, and for example, a user may watch a two-dimensional (2D) image. Alternatively, the left-eye display apparatus 12 may display a left-eye image, and the right-eye display apparatus 11 may display a right-eye image. Each of the left-eye display apparatus 12 and the right-eye display apparatus 11 may be configured as the electroluminescent display apparatus of any of FIGS. 1 to 10. For example, in the examples of FIGS. 1 to 10, an upper portion (for example, color filter layers 810 and 820), corresponding to a surface displaying an image, may face the lens array 13.

The lens array 13 may be spaced apart from each of the left-eye eyepiece lens 20a, and the left-eye display apparatus 12, and may be provided between the left-eye eyepiece lens 20a, and the left-eye display apparatus 12. For example, the lens array 13 may be disposed in front of the left-eye eyepiece lens 20a, and behind the left-eye display apparatus 12. Also, the lens array 13 may be spaced apart from each of the right-eye eyepiece lens 20b and the right-eye display apparatus 11, and may be provided between the right-eye eyepiece lens 20b and the right-eye display apparatus 11. For example, the lens array 13 may be disposed in front of the right-eye eyepiece lens 20b and behind the right-eye display apparatus 11.

The lens array 13 may be a micro-lens array. The lens array 13 may be replaced by a pin hole array. Using the lens array 13, an image displayed by the left-eye display apparatus 12 or the right-eye display apparatus 11 may be zoomed in by a certain magnification. Thus, a zoomed-in image may be viewed by a user.

A left eye LE of a user may be located at the left-eye eyepiece lens 20a. A right eye RE of the user may be located at the right-eye eyepiece lens 20b.

As seen in the example of FIG. 11C, an HIVID apparatus having the AR structure according to the present disclosure may include a left-eye display apparatus 12, a lens array 13, a left-eye eyepiece lens 20a, a transmissive reflection part 14, and a transmissive window 15. In FIG. 11C, for convenience, only left-eye elements are illustrated, and right-eye elements may be the same as the left-eye elements. The left-eye display apparatus 12, the lens array 13, the left-eye eyepiece lens 20a, the transmissive reflection part 14, and the transmissive window 15 may be accommodated into the accommodating case 10.

The left-eye display apparatus 12 may be disposed in one side (for example, an upper side) of the transmissive reflection part 14 without covering the transmissive window 15. Therefore, the left-eye display apparatus 12 may provide an image to the transmissive reflection part 14, without covering an external background seen through the transmissive window 15.

The left-eye display apparatus 12 may be configured as the electroluminescent display apparatus of any of FIGS. 1 to 10. For example, in the examples FIGS. 1 to 10, an upper portion (for example, color filter layers 810 and 820), corresponding to a surface displaying an image, may face the transmissive reflection part 14.

The lens array 13 may be provided between the left-eye eyepiece lens 20a, and the transmissive reflection part 14. The left eye of the user may be located at the left-eye eyepiece lens 20a.

The transmissive reflection part 14 may be disposed between the lens array 13 and the transmissive window 15. The transmissive reflection part 14 may include a reflection surface 14a, which may transmit a portion of light and may reflect the other portion of the light. The reflection surface 14a, may be provided so that an image displayed by the left-eye display apparatus 12 may travel toward the lens array 13. Accordingly, the user may view, through the transmissive window 15, both the external background and the image displayed by the left-eye display apparatus 12. For example, the user may simultaneously see one image, which may include a real background, and a virtual image. Thus, AR may be implemented. The transmissive window 15 may be disposed in front of the transmissive reflection part 14.

According to an embodiment of the present disclosure, because a bank for dividing individual subpixels may be not provided, an interval between the individual subpixels may be reduced, and thus, an aperture ratio may increase. Moreover, according to an embodiment of the present disclosure, because a trench may be provided in a boundary region between adjacent subpixels, at least a portion of a light-emitting layer may be disconnected (e.g., noncontiguous) in the trench region, and a leakage current may be reduced or prevented from occurring between adjacent subpixels, thereby solving a problem in which image quality may be degraded due to the leakage current.

It will be apparent to those skilled in the art that various modifications and variations may be made in the present disclosure without departing from the technical idea or scope of the disclosure. Thus, it may be intended that embodiments of the present disclosure cover the modifications and variations of the disclosure provided they come within the scope of the appended claims and their equivalents.

What is claimed is:

1. An electroluminescent display apparatus, comprising:
a substrate;
a plurality of subpixels on the substrate, the plurality of subpixel comprising:
  a first subpixel; and
  a second subpixel adjacent to the first subpixel;
a first electrode respectively in each of the plurality of subpixels, the first electrode comprising:
  a first sub-electrode; and
  a second sub-electrode;
a light-emitting layer on the first electrode;
a second electrode on the light-emitting layer; and
a planarization layer under the first electrode,
wherein a whole upper surface of the first sub-electrode and the second sub-electrode directly contacts a lower surface of the light-emitting layer, and
wherein the light-emitting layer directly contacts an upper surface of the planarization layer in a boundary between the first subpixel and the second subpixel.

2. The electroluminescent display apparatus of claim 1, wherein each first sub-electrode and second sub-electrode is electrically connected to a source electrode or a drain electrode of a driving thin-film transistor in a corresponding subpixel.

3. The electroluminescent display apparatus of claim 2, wherein:
the first sub-electrode is directly connected to the source electrode or the drain electrode via a first contact hole;
the second sub-electrode is directly connected to the source electrode or the drain electrode via a second contact hole; and
the first sub-electrode is spaced apart from the second sub-electrode.

4. The electroluminescent display apparatus of claim 2, wherein:
the first sub-electrode is directly connected to the source electrode or the drain electrode via a first contact hole;
the second sub-electrode is directly connected to the source electrode or the drain electrode via a second contact hole; and
the first sub-electrode directly contacts the second sub-electrode.

5. The electroluminescent display apparatus of claim 2, wherein:
the first sub-electrode is directly connected to the source electrode or the drain electrode via a first contact hole;
the second sub-electrode contacts the first sub-electrode; and
the second sub-electrode is electrically connected to the source electrode or the drain electrode via the first sub-electrode.

6. The electroluminescent display apparatus of claim 5, wherein a lower surface of the second sub-electrode has a flat structure.

7. The electroluminescent display apparatus of claim 1, wherein the first sub-electrode comprises:
a first bottom electrode connected to, via a first contact hole, the source electrode or the drain electrode of a corresponding driving thin-film transistor on the substrate;
a first top electrode on the first bottom electrode; and
a first filling layer in the first contact hole between the first bottom electrode and the first top electrode.

8. The electroluminescent display apparatus of claim 7, wherein both ends of the first top electrode are coextensive with both ends of the first bottom electrode.

9. The electroluminescent display apparatus of claim 7, wherein:
the second sub-electrode comprises:
  a second bottom electrode connected to the source electrode or the drain electrode via a second contact hole;
  a second top electrode on the second bottom electrode; and a second filling layer in the second contact hole between the second bottom electrode and the second top electrode; and the second bottom electrode and the second top electrode are spaced apart from the first bottom electrode and the first top electrode.

10. The electroluminescent display apparatus of claim 7, wherein:
the second sub-electrode comprises:
a second bottom electrode connected to the source electrode or the drain electrode via a second contact hole;
a second top electrode on the second bottom electrode; and
a second filling layer in the second contact hole between the second bottom electrode and the second top electrode;
the second bottom electrode is spaced apart from the first bottom electrode and the first top electrode; and
the second top electrode contacts the first bottom electrode.

11. The electroluminescent display apparatus of claim 10, wherein the second top electrode extends to a portion of an upper surface of the first top electrode.

12. The electroluminescent display apparatus of claim 7, wherein:
the second sub-electrode comprises a second bottom electrode and a second top electrode on the second bottom electrode;
the second bottom electrode is spaced apart from the first bottom electrode and the first top electrode;
the second top electrode contacts the first bottom electrode; and
a lower surface of the second bottom electrode has a flat structure.

13. The electroluminescent display apparatus of claim 1, further comprising:
a trench in a boundary between adjacent subpixels,
wherein at least a portion of the light-emitting layer is noncontiguous in the trench.

14. The electroluminescent display apparatus of claim 1, further comprising:
a lens array spaced apart from the substrate; and
an accommodating case configured to accommodate:
the substrate; and
the lens array.

15. The electroluminescent display apparatus of claim 1, wherein the first sub-electrode and the second sub-electrode comprise a same material.

16. An electroluminescent display apparatus, comprising:
a substrate;
a first subpixel and a second subpixel on the substrate;
a first electrode respectively in each of the first subpixel and the second subpixel on the substrate;
a light-emitting layer on the first electrode;
a second electrode on the light-emitting layer; and
a planarization layer under the first electrode,
wherein the first electrode of the first subpixel and the first electrode of the second subpixel face each other with the light-emitting layer therebetween,
wherein one side surface of each of the first electrode of the first subpixel and the first electrode of the second subpixel facing each other directly contacts the light-emitting layer, and
wherein the light-emitting layer directly contacts an upper surface of the planarization layer in a boundary between the first subpixel and the second subpixel.

17. The electroluminescent display apparatus of claim 16, wherein:
the first electrode comprises:
a first sub-electrode; and
a second sub-electrode;
the second sub-electrode of the first subpixel faces the first sub-electrode of the second subpixel with the light-emitting layer therebetween; and
one side surface of each of the sub-second electrode of the first subpixel and the first sub-electrode of the second subpixel facing each other contacts the light-emitting layer.

18. The electroluminescent display apparatus of claim 17, wherein:
the first sub-electrode in the first subpixel comprises:
a first bottom electrode connected to, via a first contact hole, a source electrode or a drain electrode of a driving thin-film transistor in the first subpixel;
a first top electrode on the first bottom electrode; and
a first filling layer in the first contact hole between the first bottom electrode and the first top electrode;
the second sub-electrode in the first subpixel comprises:
a second bottom electrode connected to the source electrode or the drain electrode via a second contact hole;
a second top electrode on the second bottom electrode; and
a second filling layer in the second contact hole between the second bottom electrode and the second top electrode; and
the first sub-electrode is spaced apart from the second sub-electrode.

19. The electroluminescent display apparatus of claim 17, wherein:
the first sub-electrode in the first subpixel comprises:
a first bottom electrode connected to, via a first contact hole, a source electrode or a drain electrode of a driving thin-film transistor in the first subpixel;
a first top electrode on the first bottom electrode; and
a first filling layer in the first contact hole between the first bottom electrode and the first top electrode;
the second sub-electrode in the first subpixel comprises:
a second bottom electrode connected to the source electrode or the drain electrode via a second contact hole;
a second top electrode on the second bottom electrode; and
a second filling layer in the second contact hole between the second bottom electrode and the second top electrode; and
the first sub-electrode contacts the second sub-electrode.

20. The electroluminescent display apparatus of claim 17, wherein:
the first sub-electrode in the first subpixel comprises:
a first bottom electrode connected to, via a first contact hole, a source electrode or a drain electrode of a driving thin-film transistor in the first subpixel;
a first top electrode on the first bottom electrode; and
a first filling layer in the first contact hole between the first bottom electrode and the first top electrode;
the second sub-electrode in the first subpixel comprises:
a second bottom electrode comprising a flat lower surface; and
a second top electrode on the second bottom electrode; and
the second top electrode contacts the first sub-electrode.

21. The electroluminescent display apparatus of claim 16, wherein the light-emitting layer covers a whole upper surface of the first electrode.

\* \* \* \* \*